(12) United States Patent
Son et al.

(10) Patent No.: US 9,356,033 B2
(45) Date of Patent: May 31, 2016

(54) THREE-DIMENSIONAL SEMICONDUCTOR MEMORY DEVICES AND METHODS OF FORMING THE SAME

(71) Applicants: Yong-Hoon Son, Yongin-si (KR); Jung Ho Kim, Seongnam-si (KR); Seungjae Baik, Hwaseong-si (KR); Myoungbum Lee, Seoul (KR); Kihyun Hwang, Seongnam-si (KR)

(72) Inventors: Yong-Hoon Son, Yongin-si (KR); Jung Ho Kim, Seongnam-si (KR); Seungjae Baik, Hwaseong-si (KR); Myoungbum Lee, Seoul (KR); Kihyun Hwang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/810,845

(22) Filed: Jul. 28, 2015

(65) Prior Publication Data
US 2015/0333084 A1 Nov. 19, 2015

Related U.S. Application Data

(63) Continuation of application No. 13/039,043, filed on Mar. 2, 2011, now abandoned.

(30) Foreign Application Priority Data

Mar. 3, 2010 (KR) .................. 10-2010-0018882

(51) Int. Cl.
*H01L 29/66* (2006.01)
*H01L 29/78* (2006.01)
*H01L 27/115* (2006.01)

(52) U.S. Cl.
CPC ...... *H01L 27/11551* (2013.01); *H01L 27/1157* (2013.01); *H01L 27/11556* (2013.01); *H01L 27/11578* (2013.01); *H01L 27/11582* (2013.01)

(58) Field of Classification Search
CPC ....... H01L 29/78; H01L 29/66; H01L 27/105; H01L 27/115
USPC .................. 257/288, 314, 315, 324, E27.103; 438/268
See application file for complete search history.

(56) References Cited

U.S. PATENT DOCUMENTS 8,183,624 B2 5/2012 Mizukami et al.
8,653,577 B2 2/2014 Fukuzumi et al.
(Continued)

FOREIGN PATENT DOCUMENTS

CN 101055875 A 10/2007
CN 101257024 A 9/2008
(Continued)

OTHER PUBLICATIONS

Katsumata et al. "Pipe-shaped BiCS Flash Memory with 16 Stacked Layers and Multi-Level-Cell Operation for Ultra High Density Storage Devices", 2009 Symposium on VLSI Technology Digest of Technical Papers; Yokohama, Japan, pp. 136-137.

*Primary Examiner* — Lynne Gurley
*Assistant Examiner* — Vernon P Webb
(74) *Attorney, Agent, or Firm* — Myers Bigel & Sibley, P.A.

(57) ABSTRACT

Nonvolatile memory devices include a string of nonvolatile memory cells on a substrate. This string of nonvolatile memory cells includes a first vertical stack of nonvolatile memory cells on the substrate and a string selection transistor on the first vertical stack of nonvolatile memory cells. A second vertical stack of nonvolatile memory cells is also provided on the substrate and a ground selection transistor is provided on the second vertical stack of nonvolatile memory cells. This second vertical stack of nonvolatile memory cells is provided adjacent the first vertical stack of nonvolatile memory cells. A conjunction doped semiconductor region is provided in the substrate. This conjunction doped region electrically connects the first vertical stack of nonvolatile memory cells in series with the second vertical stack of nonvolatile memory cells so that these stacks can operate as a single NAND-type string of memory cells.

16 Claims, 35 Drawing Sheets

(56) References Cited

U.S. PATENT DOCUMENTS

| | | |
|---|---|---|
| 2001/0029077 A1 | 10/2001 | Noble et al. |
| 2005/0073001 A1 | 4/2005 | Kamigaichi et al. .......... 257/315 |
| 2007/0252201 A1 | 11/2007 | Kito et al. |
| 2008/0067554 A1 | 3/2008 | Jeong et al. ................... 257/211 |
| 2008/0157092 A1* | 7/2008 | Arai ...................... H01L 27/115 257/67 |
| 2009/0173981 A1 | 7/2009 | Nitta |
| 2009/0321816 A1* | 12/2009 | Son .................. H01L 27/11556 257/326 |
| 2010/0155810 A1* | 6/2010 | Kim .................. H01L 27/11548 257/316 |
| 2011/0147824 A1 | 6/2011 | Son et al. ...................... 257/324 |

FOREIGN PATENT DOCUMENTS

| | | |
|---|---|---|
| JP | 2007-317874 | 12/2007 |
| JP | 2008-160004 | 7/2008 |
| JP | 2010021390 A | 1/2010 |
| KR | 20080092290 A | 10/2008 |
| KR | 10-2009-0047614 | 5/2009 |

\* cited by examiner

THREE-DIMENSIONAL SEMICONDUCTOR MEMORY DEVICES AND METHODS OF FORMING THE SAME

REFERENCE TO PRIORITY APPLICATIONS

This U.S. non-provisional application is a continuation of U.S. patent application Ser. No. 13/039,043, filed on Mar. 2, 2011, and claims priority to Korean Patent Application No. 10-2010-0018882, filed Mar. 3, 2010, the contents of which are hereby incorporated herein by reference in their entireties.

FIELD

The present invention relates to semiconductor devices and, more particularly, to nonvolatile semiconductor memory devices.

BACKGROUND

As the electronic industry advances to a high level, integration density of semiconductor devices increases. Higher integration of semiconductor devices is an important factor in determining product price. In other words, as integration density of semiconductor devices increases, product prices of semiconductor devices may decrease. Accordingly, requirement for higher integration of semiconductor devices is increasing. Typically, since integration of semiconductor devices is mainly determined by the area occupied by a unit memory cell, integration is greatly influenced by the level of fine pattern forming technology. However, pattern fineness is limited due to extremely expensive semiconductor equipments and/or difficulties in semiconductor fabrication processes.

To overcome such a limitation, there have been recently proposed three-dimensional semiconductor memory devices. However, since the foregoing new structure causes limitations such as process instability and/or lowering in product reliability, many studies are being conducted to overcome these limitations.

SUMMARY

Nonvolatile memory devices according to embodiments of the invention include a string of nonvolatile memory cells on a substrate. This string of nonvolatile memory cells includes a first vertical stack of nonvolatile memory cells on the substrate and a string selection transistor on the first vertical stack of nonvolatile memory cells. A second vertical stack of nonvolatile memory cells is also provided on the substrate and a ground selection transistor is provided on the second vertical stack of nonvolatile memory cells. This second vertical stack of nonvolatile memory cells is provided adjacent the first vertical stack of nonvolatile memory cells. A conjunction doped semiconductor region is provided in the substrate. This conjunction doped region electrically connects the first vertical stack of nonvolatile memory cells in series with the second vertical stack of nonvolatile memory cells so that these stacks can operate as a single NAND-type string of memory cells.

According to some of these embodiments of the invention, the first vertical stack of nonvolatile memory cells includes a first vertical stack of gate electrodes and a first vertical-type semiconductor active region on sidewalls of the first vertical stack of gate electrodes. The second vertical stack of nonvolatile memory cells may also include a second vertical stack of gate electrodes and a second vertical-type semiconductor active region on sidewalls of the second vertical stack of gate electrodes. These first and second vertical-type semiconductor active regions may contact the conjunction doped semiconductor region. In some of these embodiments of the invention, the first and second vertical-type semiconductor active regions may be of first conductivity type and the conjunction doped semiconductor region may be of second conductivity type opposite the first conductivity type. A bit line may also be provided, which is electrically connected to a terminal of the string selection transistor, and a source line may be provided, which is electrically connected to a terminal of the ground selection transistor. In particular, the first and second vertical stacks of nonvolatile memory cells and the conjunction doped semiconductor region may collectively form a single NAND-type string of nonvolatile memory cells.

According to still further embodiments of the invention, a nonvolatile memory device is provided, which comprises a string of nonvolatile memory cells on a substrate. This string of nonvolatile memory cells may include a first plurality of nonvolatile memory cells, formed as a first vertical stack of gate electrodes and a first vertical active region on the first vertical stack of gate electrodes, on the substrate. The string of nonvolatile memory cells may also include a second plurality of nonvolatile memory cells, formed as a second vertical stack of gate electrodes and a second vertical active region on the second vertical stack of gate electrodes, on the substrate. A string selection transistor may be provided, which has a gate electrode on the first vertical stack of gate electrodes. A ground selection transistor may be provided, which has a gate electrode on the second vertical stack of gate electrodes. A semiconductor region of first conductivity type is provided in the substrate. This semiconductor region forms at least one of a P-N rectifying junction and doped/undoped semiconductor junction with the first and second vertical active regions. A bit line may be provided, which is electrically connected to a terminal of the string selection transistor, and a source line may be provided, which is electrically connected to a terminal of the ground selection transistor.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
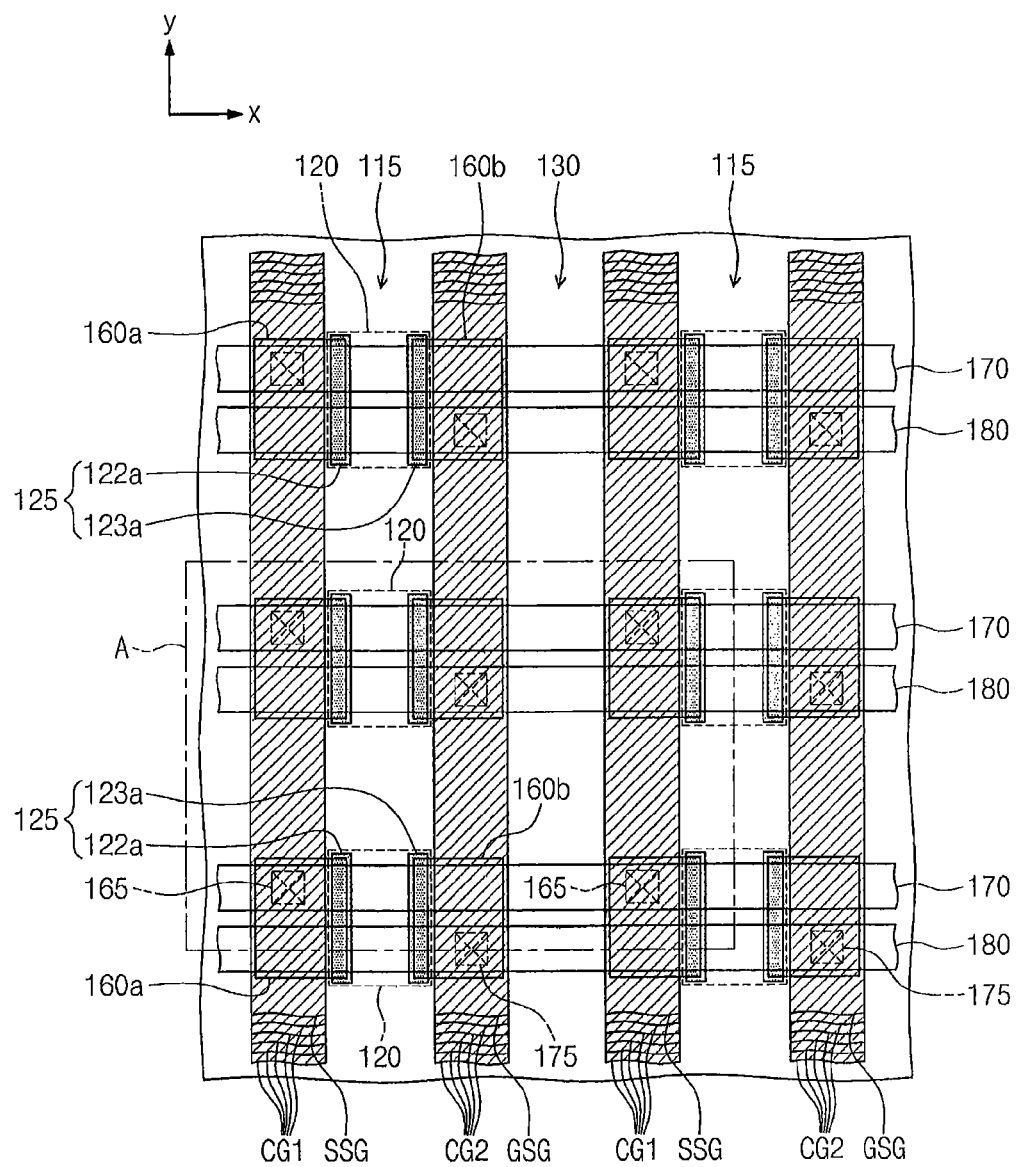
FIG. 1 is a plan view illustrating a three-dimensional semiconductor memory according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, exemplary embodiments of the inventive concept will be described in detail with reference to the accompanying drawings.

First Embodiment

Figure 2A:
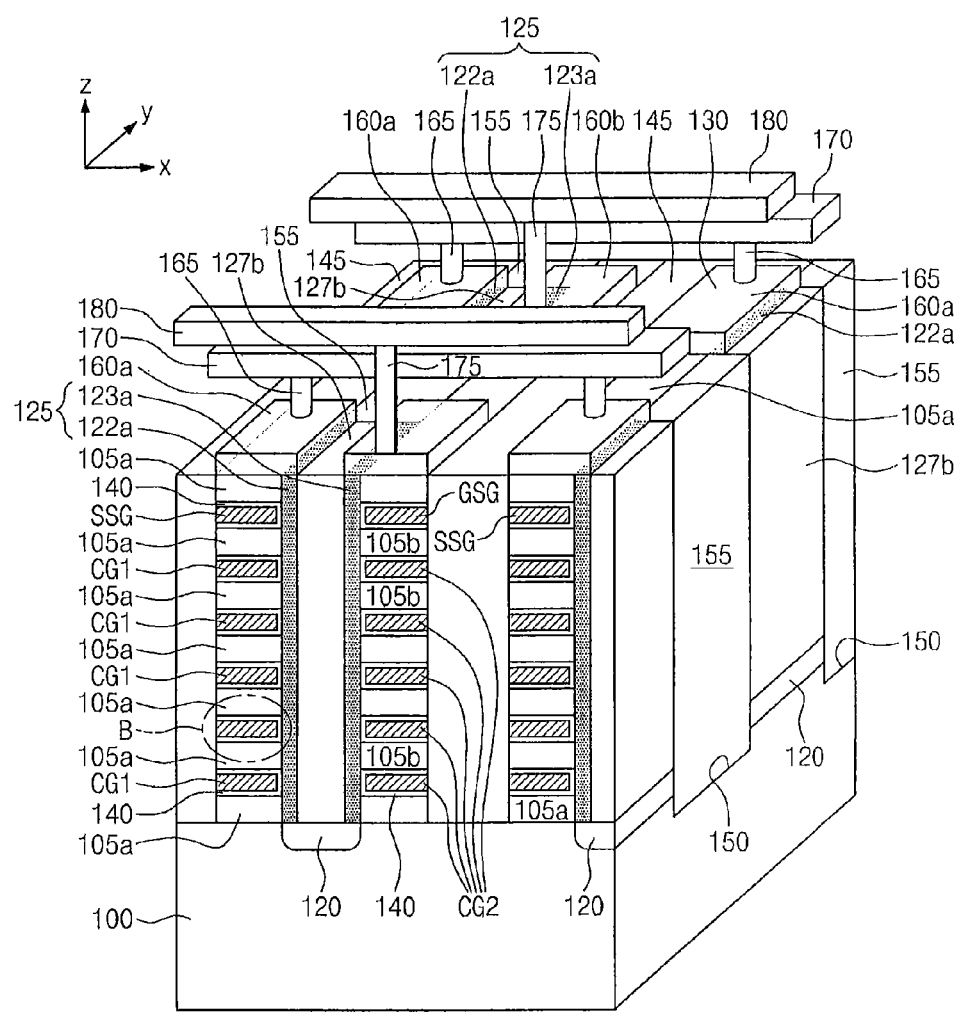
FIG. 2A is a perspective view illustrating a portion A of FIG. 1.
Figure 3:
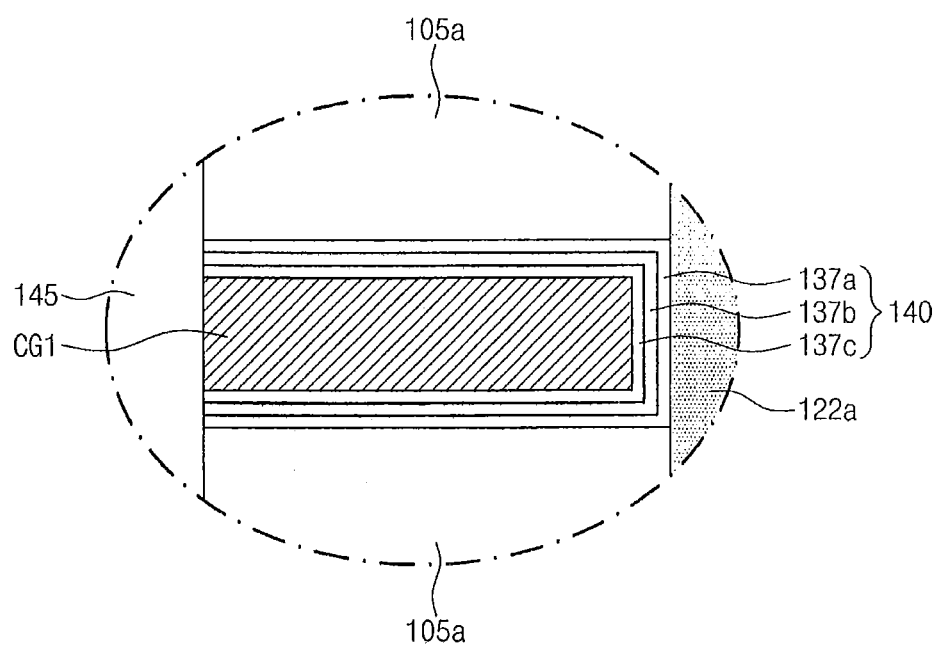
FIG. 3 is a magnified view illustrating a portion B of FIG. 2A.

FIG. 1 is a plan view illustrating a three-dimensional semiconductor memory according to an embodiment of the inventive concept. FIG. 2A is a perspective view illustrating a portion A of FIG. 1. FIG. 3 is a magnified view illustrating a portion B of FIG. 2A.

Referring to FIGS. 1 and 2A, a first gate stack and a second gate stack may be disposed laterally spaced from each other over a semiconductor substrate (hereinafter, referred to as a substrate) 100. The substrate 100 may be a silicon substrate, a germanium substrate, or a silicon-germanium substrate. The substrate 100 may be doped with a first-type dopant. For example, a well region doped with the first-type dopant may be formed in the substrate 100.

The first gate stack may include first dielectric patterns 105a and first gates CG1 and SSG that are alternately and repeatedly stacked over the substrate 100, and the second gate stack may include second dielectric patterns 105b and second gates CG2 and GSG that are alternately and repeatedly stacked over the substrate 100 at one side of the first gate stack. The first and second gate stacks may be parallelly extended in a first direction parallel to the top surface of the substrate 100. Accordingly, the first and second gates CG1, SSG, CG2 and GSG and the first and second dielectric patterns 105a and 105b may have a line shape parallelly extending in the first direction.

The first gates CG1 and SSG included in the first gate stack may include a plurality of first cell gates CG1 that are stacked, and a string selection gate SSG disposed over the uppermost first cell gate. The stacked first cell gates CG1 and the string selection gate SSG may be insulated from each other by the first dielectric patterns 105a. The lowermost first gate among the first gates CG1 and SSG of the first gate stack may be a lowermost first cell gate CG1. The second gates CG2 and GSG included in the second gate stack may include a plurality of second cell gates CG2 that are stacked, and a ground selection gate GSG disposed over the uppermost second cell gate. The stacked second cell gates CG2 and the ground selection gate GSG may be insulated from each other by the second dielectric patterns 105b. The lowermost second gate among the second gates CG1 and GSG included in the second gate stack may be a lowermost second cell gate CG2. The first and second gates CG1, SSG, CG2 and GSG may include at least one selected from doped group 4A elements (e.g., doped silicon and doped germanium), conductive metal nitrides (e.g., titanium nitride and tantalum nitride), metal (e.g., titanium, tantalum, tungsten, and aluminum), and metal-group 4A element compound (e.g., cobalt silicide, tungsten silicide, and titanium silicide). The first and second dielectric pattern 105a and 105b may be formed of oxide.

As shown in FIGS. 1 and 2A, the first gates CG1 and SSG may include one string selection gate SSG, but embodiments of the inventive concept are not limited thereto. According to an embodiment of the inventive concept, the first gates CG1 and SSG may include a plurality of string selection gates SSG that are stacked over the uppermost first cell gate. In this case, the first dielectric patterns 105a may further include first dielectric patterns that are disposed between the string selection gates SSG stacked in the first gate stack. Similarly, the second gates CG2 and GSG may include one ground selection gate GSG disposed over the uppermost cell gate, or may include a plurality of ground selection gates GSG stacked over the uppermost second cell gate.

The lowermost first dielectric pattern among the first dielectric patterns 105a may be disposed between the substrate 100 and the lowermost first gate among the stacked first gates CG1 and SSG. Similarly, the lowermost second dielectric pattern among the second dielectric patterns 105b may be disposed between the substrate 100 and the lowermost second gate among the stacked second gates CG2 and GSG. The lowermost first and second dielectric patterns may have thicknesses equal to or smaller than those of first and second dielectric patterns that are located at higher positions than the lowermost first and second dielectric patterns.

The uppermost first dielectric pattern among the first dielectric patterns 105a may be disposed over the uppermost first gate among the stacked first gates CG1 and SSG. The uppermost second dielectric pattern among the second dielectric patterns 105b may be disposed over the uppermost second gate among the stacked second gates CG2 and SSG. The uppermost first and second dielectric patterns may have thicknesses equal to or smaller than those of first and second dielectric patterns that are located at lower positions than the uppermost first and second dielectric patterns.

The first and second gate stacks may be configured with one gate stack group. The gate stack group may be provided in plurality over the substrate 100. The gate stack groups may extend in the first direction side by side. The gate stack groups may be spaced from each other in a second direction perpendicular to the first direction and parallel to the substrate 100, and. The first direction may correspond to the y-axis direction of FIGS. 1 and 2A, and the second direction may correspond to the x-axis direction. A groove 115 may be defined between the first and second gate stacks in each of the gate stack groups.

An active structure 125 may be disposed between the first and second gate stacks of the gate stack group. In other words, the active structure 125 may be disposed in the groove 115. The active structure 125 may include a first vertical-type active portion 122a and a second vertical-type active portion 123a. The first vertical-type active portion 122a may overlap sidewalls of the first gates CG1 and SSG in the first gate stack. The second vertical-type active portion 123a may overlap sidewalls of the first second gates CG2 and GSG. More specifically, each of the first gates CG1 and SSG may have both sidewalls extending in the first direction side by side, and each of the second gates CG2 and GSG may also have both sidewalls extending in the first direction side by side. The first vertical type active portion 122a may overlap a portion of one sidewall of each of the first gates CG1 and SSG extending the first direction. The second vertical type active portion 123a may be overlap a portion of one sidewall of each of the second gates CG2 and GSG. The one sidewalls of the first gates CG1 and SSG overlapping the first vertical-type active portion 122a may face the one sidewalls of the second gates CG2 and GSG overlapping the second vertical-type active portion 123a. The first and second vertical-type active portions 122a and 123a may be formed of material having semiconductor characteristics. For example, the first and second vertical-type active portions 122a and 123a may be formed of silicon, germanium, and/or silicon-germanium. The first and second vertical-type active portions 122a and 123a may be doped with the first-type dopant, or may be undoped.

A gate dielectric layer 140 may be disposed between the first gates CG1 and SSG and the first vertical-type active portion 122a, and between the second gates CG2 and GSG and the second vertical-type active portion 123a. The gate dielectric layer 140 disposed between the first cell gate CG1 and the first vertical-type active portion 122a and between the second cell gate CG2 and the second vertical-type active portion 123a may include an information storage element. The gate dielectric layer 140 may be described in detail with reference to FIG. 3. FIG. 3 is a magnified view illustrating a gate dielectric layer 140 disposed between the first cell gate CG1 and the first vertical-type active portion 122a.

Referring to FIGS. 1, 2A, and 3, the gate dielectric layer 140 may include a tunnel dielectric layer 137a, an information storage layer 137b, and a blocking dielectric layer 137c. The information storage layer 137b may be disposed between the tunnel dielectric layer 137a and the blocking dielectric layer 137c. The information storage layer 137b may correspond to the information storage element. The tunnel dielectric layer 137a may be adjacent to the first vertical-type active portion 122a, and the blocking dielectric layer 137c may be adjacent to the first cell gate CG1. The information storage layer 137b may include a dielectric layer including traps that can store electric charges. For example, the information storage layer 137b may include a nitride layer, a metal oxide layer (e.g., hafnium oxide layer and aluminum oxide), and/or nano dots. The nano dots may be formed of group 4A elements and/or metal, but embodiments of the inventive concept are not limited thereto. The information storage layer 137b may be implemented in other forms. The tunnel dielectric layer 137a may be formed of a single-layer or a multi-layer selected from an oxide layer, a nitride layer, an oxynitride layer, and a metal oxide layer. The blocking dielectric layer 137c may be formed of a single-layer or a multi-layer selected from an oxide layer and a high dielectric layer (e.g., metal oxide layer such as aluminum oxide layer and hafnium oxide layer) having a higher dielectric constant than that of the tunnel dielectric layer 137a.

Referring again to FIGS. 1 and 2A, the gate dielectric layer 140 may extend to be disposed between each of the gates CG1, SSG, CG2 and GSG and the dielectric pattern 105a or 15b adjacent thereto. The gate dielectric layer 140 near the selection gates SSG and GSG may be formed of the same material as the gate dielectric layer 140 near the cell gates CG1 and CG2. The first vertical-type active portion 122a may contact one sidewalls of the first dielectric patterns 105a constituting one sidewall of the groove 115, and the second vertical-type active portion 123a may contact one sidewalls of the second dielectric patterns 105b constituting the other sidewall of the groove 115.

A conjunction doped region 120 may be disposed in the substrate 100 under the active structure 125. The conjunction doped region 120 may be connected to lower ends of the first and second vertical-type active portions 122a and 123a in the active structure 125. More specifically, the conjunction doped region 120 may contact the lower ends of the first and second vertical-type active portions 122a and 123a. Major carriers in the conjunction doped region 120 may be identical to carriers in channels generated in the first and second vertical-type active portions 122a and 123a by an operating voltage applied to the gates CG1, SSG, CG2 and GSG. The conjunction doped region 120 may be doped with a second-type dopant. One of the first-type dopant and the second-type dopant may be an n-type dopant, and the other may be a p-type dopant.

A crossing region between the first vertical-type active portion 122a and the first cell gate CG1 may be defined as a first cell region, and a crossing region between the second vertical-type active portion 123a and the second cell gate CG2 may be defined as a second cell region. Also, a crossing region between the first vertical-type active portion 122a and the string selection gate SSG may be defined as a string selection region, and a crossing region between the second vertical-type active portion 123a and the ground selection gate GSG may be defined as a ground selection region. The first cell gate CG1, the first vertical-type active portion 122a, and the gate dielectric layer 140 therebetween in the first cell region may be included in a first cell transistor, and the second cell gate CG2, the second vertical-type active portion 123a, and the gate dielectric layer 140 therebetween in the second cell region may be included in a second cell transistor. Similarly, the string selection gate SSG, the first vertical-type active portion 122a, and the gate dielectric 140 therebetween in the string selection region may be included in a string selection transistor, and the ground selection gate GSG, the second vertical-type active portion 123a, and the gate dielectric 140 therebetween in the ground selection region may be included in a ground selection transistor.

Due to the first gates CG1 and SSG of the first gate stack and the first vertical-type active portion 122a, the plurality of first cell transistors and the string selection transistor may be sequentially stacked to be connected in series to each other. Similarly, due to the second gates. CG2 and GSG of the second gate stack and the second vertical-type active portion 123a, the plurality of second cell transistors and the ground selection transistor may be sequentially stacked to be connected in series to each other. In this case, the conjunction doped region 120 may be connected to the lower ends of the first and second vertical-type active portions 122a and 123a as described above. Accordingly, a lowermost first cell transistor including the lowermost first cell gate CG1 and the first vertical-type active portion 122a overlapping the lowermost first cell gate CG1 may be connected to in series to a lowermost second cell transistor including the lowermost second cell gate CG2 and the second vertical-type active portion 123a overlapping the lowermost second cell gate CG2. As a result, the conjunction doped region 120, and the stacked first cell transistors and string selection transistor and the stacked second cell transistors and ground selection transistor that are implemented with the active structure 125 may form one cell string. The cell string may have a "U" shape on the x-z plane according to the first vertical-type active portion 122a, the conjunction doped region 120, and the second vertical type active portion 123a.

Referring again to FIGS. 1 and 2A, the active structure 125 may be provided in plurality in the groove 115. The active structures 125 in the groove 115 may be spaced from each other in the first direction. Also, the conjunction doped region 120 may also be provided in plurality in the substrate 100 under the bottom surface of the groove 115. The conjunction doped regions 120 under the groove 115 may be disposed under the active structures 125 in the groove 115, respectively. Each of the conjunction doped regions 120 may be connected to the lower ends of the first and second vertical-type active portions 122a and 123a in each of the active structures 125. The conjunction doped regions 120 under the groove 115 may be aligned along the first direction, and may be spaced from each other. As a result, due to the respective gate stack groups, the active structures 125 in the groove 115, and the conjunction doped regions 120 under the groove 115, a plurality of cell strings aligned in the first direction and having the "U" shape may be implemented. As described above, the plurality of gate stack group may be disposed over the substrate 100. Accordingly, a plurality of grooves 115 may be defined over the substrate 100, the plurality of active structures 125 may be disposed in each of the grooves 115, and the plurality of conjunction doped regions 120 may be disposed in the substrate 100 under each of the grooves 115. As a result, as shown in FIG. 1, the active structures 125 and the conjunction doped regions 120 may be two-dimensionally arranged along the first and second directions in plan view.

The string selection gate SSG and the ground selection gate GSG may be controlled independently of each other. The first cell gates CG1 located at different levels may be controlled independently of each other, and the second cell gates CG2 located at different levels may be controlled independently of each other. Furthermore, the first gate CG1 and the second gate CG2 located at the same level may be controlled independently of each other.

As describe above, the plurality of gate stack groups may be disposed over the substrate 100. In this case, according to an embodiment, the first cell gates CG1 respectively disposed in the gate stack groups and located at the same level may be electrically connected to each other. Similarly, the second cell gates CG2 respectively disposed in the gate stack groups and located at the same level may be electrically connected to each other.

A first filling-dielectric pattern 127b may be disposed between the first and second vertical-type active portions 122a and 123a in each of the active structures 125. According to an embodiment of the inventive concept, the first filling-dielectric pattern 127b may contact the conjunction doped region 120 between the first and second vertical-type active portions 122a and 123a. The first filling-dielectric pattern 127b may be formed of oxide, nitride, and/or oxynitride. A second filling-dielectric pattern 155 may fill a space between the active structures 125 adjacent to each other in the groove 115. The second filling-dielectric pattern 155 may be formed of oxide, nitride, and/or oxynitride. A device isolation pattern 147 may fill a trench 130 defined between the gate stack groups. The device isolation pattern 147 may be formed of oxide, nitride, and/or oxynitride.

According to an embodiment of the inventive concept, the top surface of the substrate 100 between the conjunction doped regions 120 disposed under the groove 115 may be recessed compared to the top surface of the conjunction doped region 120. Accordingly, a recess region 150 may be defined between the conjunction doped regions 120 under the groove 115. The bottom surface of the recess region 150 may be lower than the bottom surface of the conjunction doped region 120. The second filling-dielectric pattern 155 may extend downward to fill the recess region 150.

A bit line 170 may be electrically connected to the upper end of the first vertical-type active portion 122a. The bit line 170 may be located higher than the upper end of the vertical-type active portion 122a. The bit line 170 may cross the first and second gates CG1, SSG, CG2, and GSG. For example, the bit line 170 may extend in the second direction. A plurality of bit lines 170 may extend in the second direction side by side over the substrate 100. The respective bit line 170 may be electrically connected to the upper ends of the first vertical-type active portions 122a in the active structures 125 that are arranged in the second direction to form a row.

A first conductive pad 160a may be disposed on the first vertical-type active portion 122a. The first conductive pad 160a may contact the upper end of the first vertical-type active portion 122a. The first conductive pad 160a may laterally extend to be disposed on the first dielectric pattern 105a as well. The first conductive pad 160a may be formed of at least one selected from doped group 4A elements (e.g., doped silicon and doped germanium), conductive metal nitrides (e.g., titanium nitride and tantalum nitride), metal (e.g., titanium, tantalum, tungsten, and aluminum), and metal-group 4A element compound (e.g., cobalt silicide, tungsten silicide, and titanium silicide). A drain region doped with the second-type dopant may be disposed in an upper portion of the first vertical-type active portion 122a. The bottom surface of the drain region may have a height similar to the top surface of the string selection gate SSG. The drain region may contact the undersurface of the first conductive pad 160a. According to an embodiment of the inventive concept, the drain region may be omitted. The bit line 170 may be electrically connected to the first conductive pad 160a. That is, the bit line 170 may be electrically connected to the upper end of the first vertical-type active portion 122a via the first conductive pad 160a.

A source line 180 may be electrically connected to the upper end of the second vertical-type active portion 123a. The source line 180 may be located higher than the upper end of the second vertical-type active portion 123a. A second conductive pad 160b may be disposed over the second vertical-type active portion 123a. The second conductive pad 160b may contact the upper end of the second vertical-type active portion 123a. The second conductive pad 160b may laterally extend to be disposed on the second dielectric pattern 105b as well. The second conductive pad 160b may be formed of the same material as the first conductive pad 160a. A source region doped with the second-type dopant may be disposed in an upper portion of the second vertical-type active portion 122b. The bottom surface of the source region may have a height similar to the top surface of the ground selection gate GSG. The source region may contact the undersurface of the second conductive pad 160b. According to an embodiment of the inventive concept, the source region may be omitted. The source line 180 may be electrically connected to the second conductive pad 160b. That is, the source line 180 may be electrically connected to the upper end of the second vertical-type active portion 123a via the second conductive pad 160b.

The source line 180 may extend in parallel to the bit line 170. The source line 180 may be provided in plurality over the substrate 100. Each of the source lines 170 may be electrically connected to the upper ends of the second vertical-type active portions 123a in the plurality of active structures 125 arranged along the second direction.

The source line 180 and the bit line 170 may be located at different levels with respect to the top surface of the substrate 100. For example, as shown in FIG. 2A, the source line 180 may be disposed higher than the bit line 170. A first interlayer dielectric may cover the entire surface of the substrate 100 including the first and second conductive pads 160a and 160b, and the bit line 170 may be disposed over the first interlayer dielectric. The bit line 170 may be electrically connected to the first conductive pad 160a via a bit line plug 165, penetrating the first interlayer dielectric. A second interlayer dielectric may cover the first interlayer dielectric and the bit line 170. The source line 180 may be electrically connected to the second conductive pad 160b via a source line plug 175 penetrating the second and first interlayer dielectrics. The first and second interlayer dielectrics have been omitted in FIG. 2A to emphasize the features of this embodiment of the inventive concept.

It has been described that the source line 180 may be higher than the bit line 170, but embodiments of the inventive concept are not limited thereto. According to an embodiment of the inventive concept, the bit line 170 may be disposed higher than the source line 180. In this case, the source line 180 may be disposed between the second interlayer dielectric and the first interlayer dielectric, and the bit line 170 may be disposed over the second interlayer dielectric. Otherwise, the bit line 170 and the source line 180 may be located at the same level.

It has been described that the source line 180 may be parallel to the bit line 170, but embodiments of the inventive concept are not limited thereto. According to an embodiment of the inventive concept, the source line 180 may be disposed at a different level from the bit line 170, and may extend in the first direction to traverse the bit line 170. In this case, the source line 180 may be electrically connected to the second vertical-type active portions 123a of the active structures 125 located in the respective grooves 115.

The bit line 170 may include conductive material having a low resistivity. For example, the bit line 170 may include at least one selected from metal (e.g., tungsten, titanium, tantalum, aluminum, and copper), conductive metal nitrides (e.g., titanium nitride and tantalum nitride), and metal-group 4A element compounds (e.g., tungsten silicide and cobalt silicide). The source line 180 may include conductive material having a low resistivity. For example, the source line 180 may include conductive material having a lower resistivity than that of a doped group 4A element (e.g., doped silicon). For example, the source line 180 may include at least one selected from metal (e.g., tungsten, titanium, tantalum, aluminum, and copper), conductive metal nitrides (e.g., titanium nitride and tantalum nitride), and metal-group 4A element compound (e.g., tungsten silicide and cobalt silicide). The bit line plug 165 may include at least one selected from doped group 4A elements (e.g., doped silicon), metal (e.g., tungsten, titanium, tantalum, aluminum, and copper), conductive metal nitrides (e.g., titanium nitride and tantalum nitride), and metal-group 4A element compounds (e.g., tungsten silicide and cobalt silicide). The source line plug 175 may include at least one selected from doped group 4A elements (e.g., doped silicon), metal (e.g., tungsten, titanium, tantalum, aluminum, and copper), conductive metal nitrides (e.g., titanium nitride and tantalum nitride), and metal-group 4A element compounds (e.g., tungsten silicide and cobalt silicide).

According to the above-described semiconductor memory device, the cell string may have the first cell gate CG1 and string selection gate SSG being stacked, the second cell gate CG2 and ground selection gate GSG being stacked, the first and second vertical-type active portions 122a and 123a, and the conjunction doped region 120, such that the cell, string may be configured to have the "U" shape. Accordingly, the source line 180, to which a reference voltage is applied, may be formed of a conductive material having a low resistivity. As a result, a three-dimensional semiconductor memory device having excellent reliability can be implemented. Also, a three-dimensional semiconductor memory device capable of operating at a high speed can be implemented. Also, the first and second vertical-type active portions 122a and 123a may be connected with the conjunction doped region 120, such that the structure of a cell string having the "U" shape can be simplified.

According to the above-described semiconductor memory device, the conjunction doped regions 120 under the groove 115 may be electrically separated from each other by the second filling-dielectric pattern 155 filling the recess region 150. Otherwise, the conjunction doped regions 120 under the groove 115 may be electrically separated in other forms, which will be described in detail with reference to the accompanying drawings. Hereinafter, elements of modified embodiments will be denoted by the same reference numerals as the above-described elements.

Figure 2B:
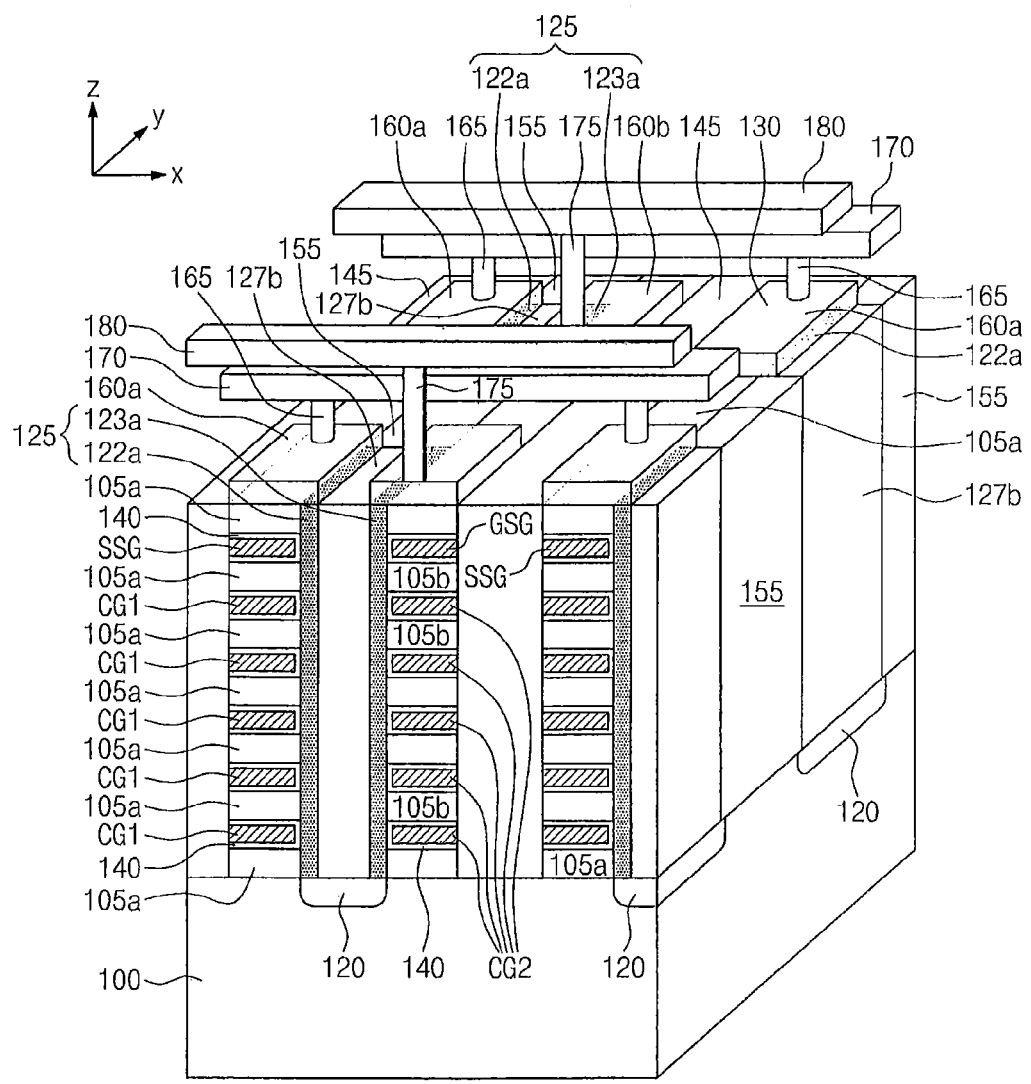
FIG. 2B is a perspective view illustrating the portion A of FIG. 1 to describe a modified embodiment of a three-dimensional semiconductor memory device according to an embodiment of the inventive concept.

FIG. 2B is a perspective view illustrating the portion A of FIG. 1 to describe a modified embodiment of a three-dimensional semiconductor memory device according to an embodiment of the inventive concept.

Referring to FIG. 2B, the whole of the bottom surface of the groove 115 between the first gate stack and the second gate stack may have the same level. In other words, the top surface of the substrate 100 between the conjunction doped regions 120 under the groove 115 may be located at the substantially same level as the top surface of the conjunction doped region 120. (the recess region 150 of FIG. 2A may be omitted in this modified embodiment) In this case, the substrate 100 between the conjunction doped regions 120 may be doped with the first-type dopant as described above. Thus, the conjunction doped regions 120 doped with the second-type dopant may be electrically separated from each other.

Figure 2C:
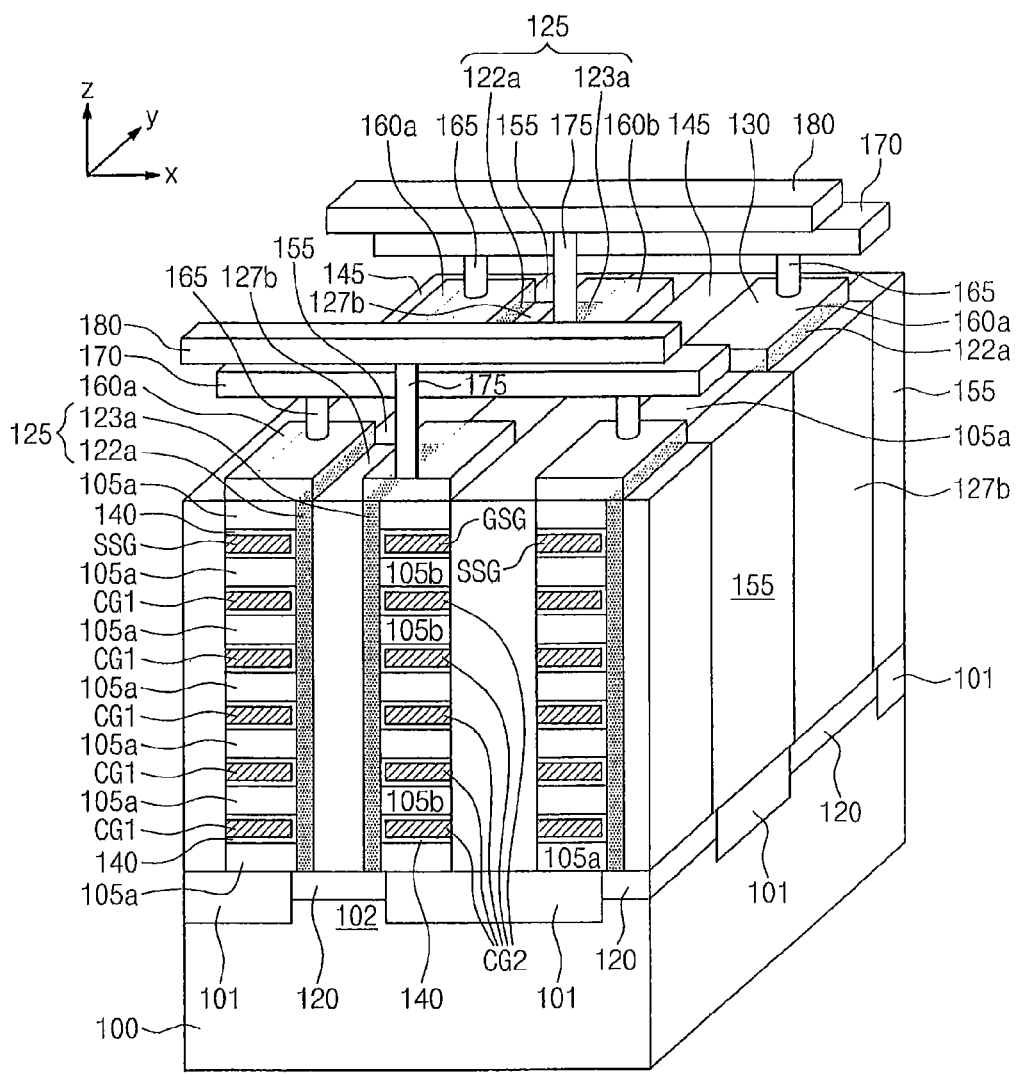
FIG. 2C is a perspective view illustrating the portion A of FIG. 1 to describe another modified embodiment of a three-dimensional semiconductor memory device according to an embodiment of the inventive concept.

FIG. 2C is a perspective view illustrating the portion A of FIG. 1 to describe another modified embodiment of a three-dimensional semiconductor memory device according to an embodiment of the inventive concept.

Referring to FIG. 2C, the three-dimensional semiconductor memory device may further include a field dielectric pattern 101 formed in the substrate 100 to define base active portions 102. The field dielectric pattern 101 may fill a base trench formed in the substrate 100. The base active portions 102 may be spaced from each other. For example, the base active portions 102 may be two-dimensionally arranged along the first and second directions in plan view. The conjunction doped regions 120 may be formed in the base active portions 102, respectively. Thus, the conjunction doped regions 102 may be electrically separated from each other by the field dielectric pattern 101. The bottom surface of the groove 115 between the first and second gate stacks may be composed of the base active portion 102 arranged in the first direction and the field dielectric pattern 101 between the base active portions 102.

Figure 2D:
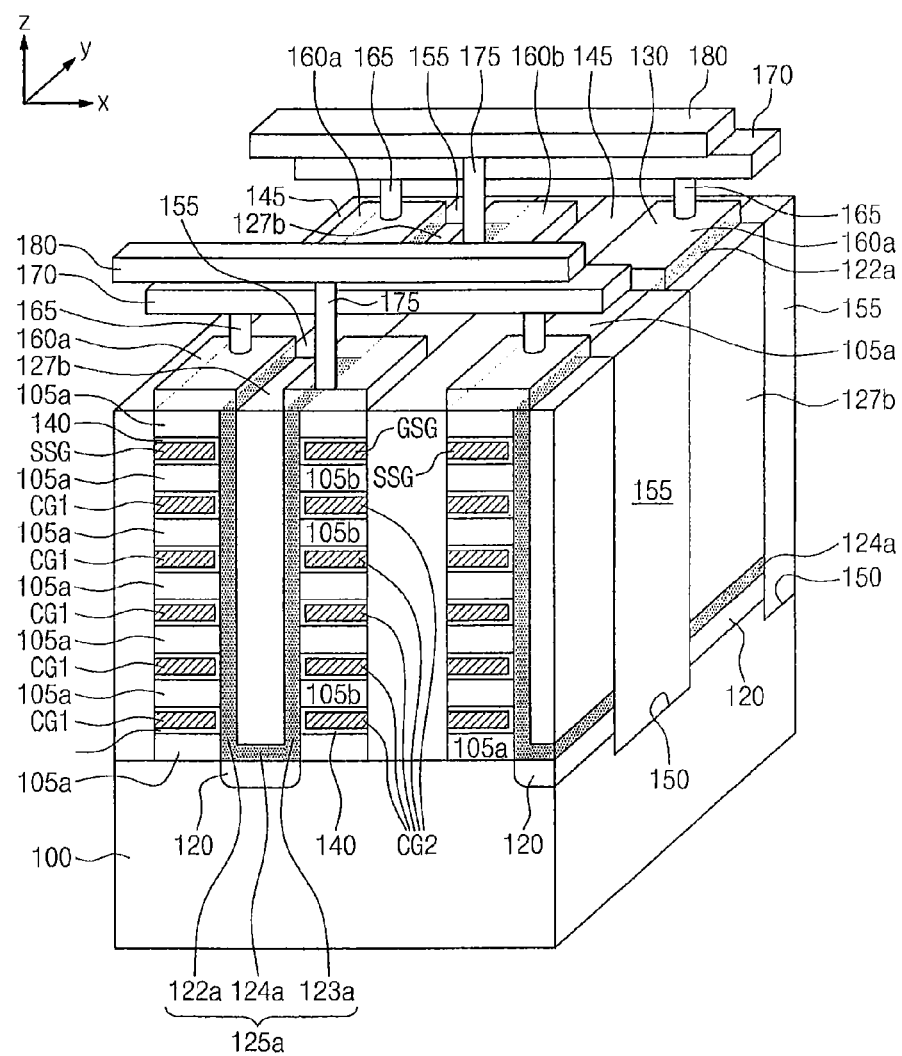
FIG. 2D is a perspective view illustrating the portion A of FIG. 1 to describe still another modified embodiment of a three-dimensional semiconductor memory device according to an embodiment of the inventive concept.

FIG. 2D is a perspective view illustrating the portion A of FIG. 1 to describe still another modified embodiment of a three-dimensional semiconductor memory device according to an embodiment of the inventive concept. The three-dimensional semiconductor memory device according to this modified embodiment may include an active structure different from the active structure of FIG. 2A.

Referring to FIG. 2D, an active structure 125a may include a first vertical-type active portion 122a, a second vertical-type active portion 123a, and a planar portion 124a. The planar portion 124a may be disposed between the first filling-dielectric pattern 127b and the substrate 100. The planar portion 124a may be disposed between the first filling-dielectric pattern 127b and the conjunction doped region 120. The planar portion 124a may contact the conjunction doped region 120. The planar portion 124a may be connected to the first and second vertical-type active portions 122a and 123a. The planar portion 124a may contact the first and second vertical-type active portions 122a and 123a without a boundary surface. That is, the planar portion 124a and the first and second vertical-type active regions 122a and 123a may be one body. The planar portion 124a may be formed of the same material as the first and second vertical-type active portions 122a and 123a.

The active structure 125a shown in FIG. 2D may also be applied to the three-dimensional semiconductor memory devices shown in FIGS. 2B and 2C. That is, the active structures 125 may be substituted with the active structure 125a of FIG. 2D.

Next, a method for forming a three-dimensional semiconductor memory device according to an embodiment of the inventive concept will be described in detail with reference to the accompanying drawings.

FIGS. 4A through 4J are perspective views illustrating a method for forming a three-dimensional semiconductor memory device according to an embodiment of the inventive concept.

Figure 4A:
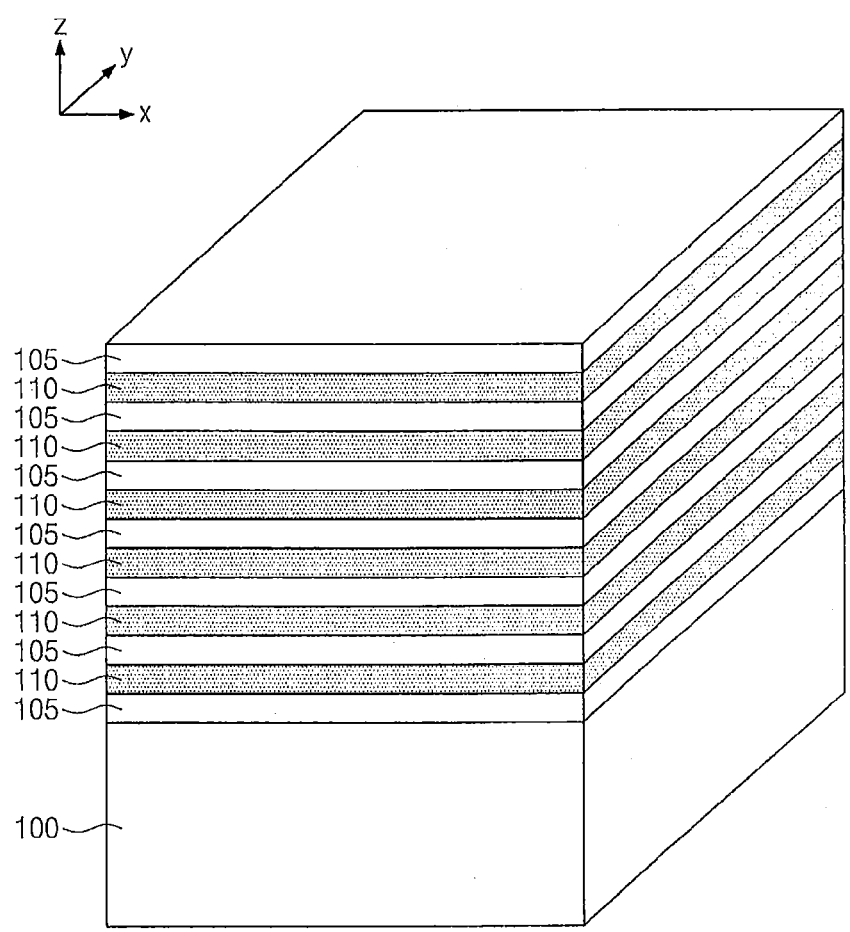
FIGS. 4A through 4J are perspective views illustrating a method for forming a three-dimensional semiconductor memory device according to an embodiment of the inventive concept.

Referring to FIG. 4A, dielectric layers 105 and sacrificial layers 110 may be alternately and repeatedly stacked over the substrate 100. The substrate 100 may be a silicon substrate, a germanium substrate, or a silicon-germanium substrate. The substrate 100 may be doped with a first-type dopant. The sacrificial layers 110 may be formed of a material having an etch selectivity with respect to the dielectric layers 105. For example, when the dielectric layer 105 are formed of an oxide layer, the sacrificial layer 110 may be formed of a nitride layer and/or an oxynitride layer. The lowermost dielectric layer may be formed between the lowermost sacrificial layer and the substrate 100. The lowermost dielectric layer may be formed to have a thickness equal to or smaller than those of dielectric layers disposed thereover. The uppermost dielectric layer may be formed over the uppermost sacrificial layer. The uppermost dielectric layer may be formed to have a thickness equal to or greater than those of dielectric layers disposed thereunder. The number of the layers of the dielectric layers 105 may be greater than that of the sacrificial layers 110 by 1.

Figure 4B:
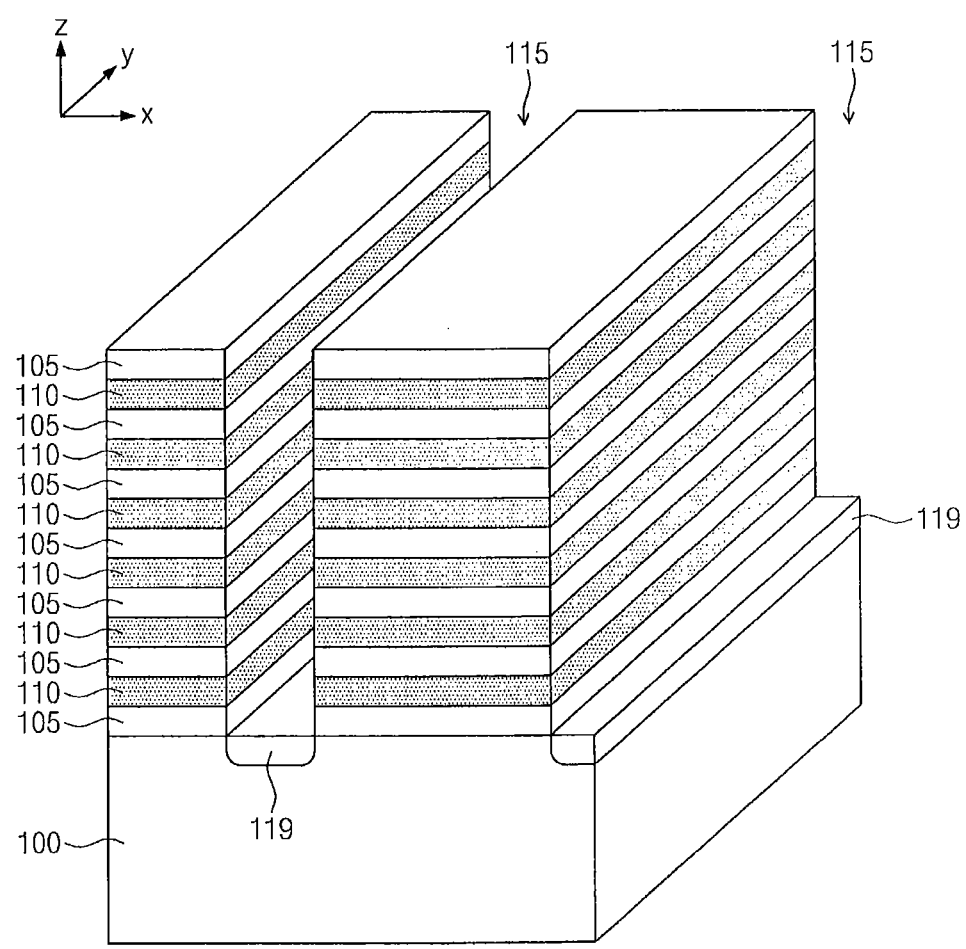

Referring to FIG. 4B, the dielectric layers 105 and the sacrificial layers 110 may be continuously patterned to form grooves 115. The grooves 115 may extend in a first direction parallel to the top surface of the substrate 100 side by side. The grooves 115 may be parallel to the top surface of the substrate 100, and may be spaced from each other in a second direction perpendicular to the first direction. The first direction may correspond to the y-axis direction, and the second direction may correspond to the x-axis direction in the drawing.

A second-type dopant may be provided to the substrate 100 having the grooves 115 by an ion implantation method to form a preliminary doped region 119 in the substrate under the bottom surface of the groove 115. The second-type dopant may be provided to the substrate 100 under the bottom surface of the groove 115 through the groove 115. Thus, the preliminary doped region 119 may be formed in self-alignment with the groove 115.

Figure 4C:
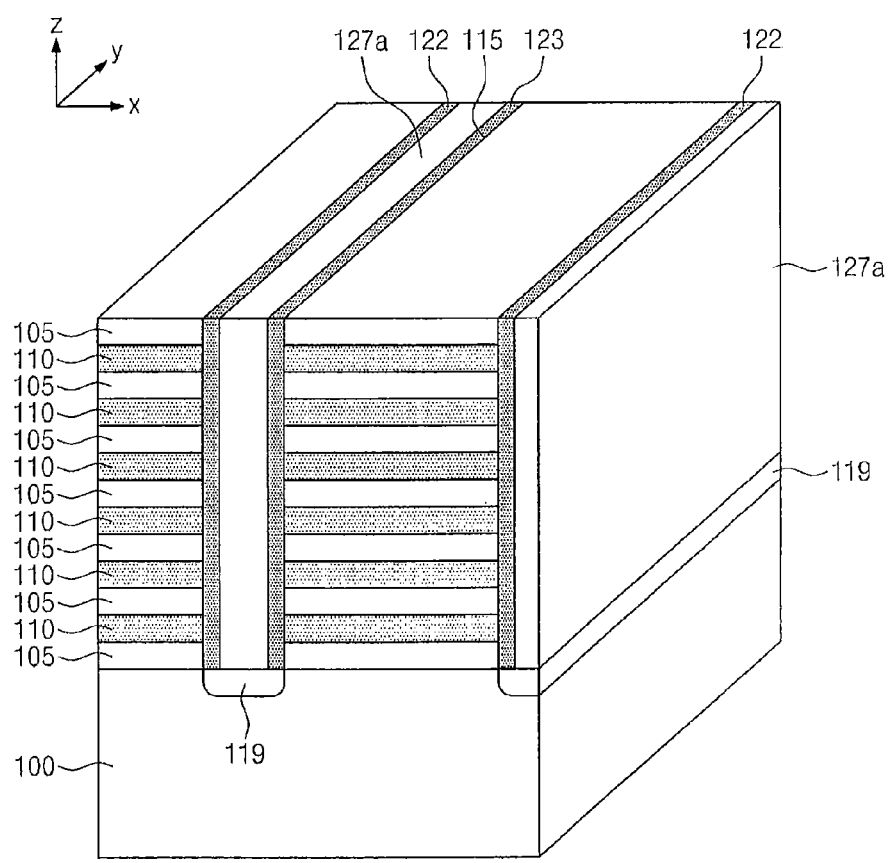

Referring to FIG. 4C, an active layer may be conformally formed over the substrate 100 having the preliminary doped region 119, and an anisotropic etching may be performed on the active layer to form a preliminary active structure. The preliminary active structure may include a first preliminary active portion 122 contacting a first sidewall of the groove 115, and a second preliminary active portion 123 contacting a second sidewall of the groove 115. The first and second preliminary active portions 122 and 123 may extend in the first direction along the first and second sidewalls of the groove 115 side by side. The lower ends of the first and second preliminary active portions 122 and 123 may contact the preliminary doped region 119. The preliminary doped region 119 between the first and second preliminary active portions 122 and 123 may be exposed. The first and second preliminary active portions 122 and 123 may be formed of group 4A elements (e.g., silicon, germanium, or silicon-germanium). The first and second preliminary active portions 122 and 123 may be doped with the first-type dopant, or may be undoped.

A first filling-dielectric layer 127a may be formed to fill the groove 115 over the substrate 100 having the preliminary active structure. The first filling-dielectric layer 127a may be planarized. The first filling-dielectric layer 127a may be planarized until the upper ends of the preliminary active portions 122 and 123 are exposed. Thus, the planarized first filling-dielectric layer 127a may be formed in the groove 115. The planarized first filling-dielectric layer 127a may contact the preliminary doped region 119 between the first and second preliminary active portions 122 and 123. The planarized first filling-dielectric layer 127a may be formed of a material having an etch selectivity with respect to the sacrificial layers 110. For example, the planarized first filling-dielectric layer 127a may be formed of oxide.

Figure 4D:
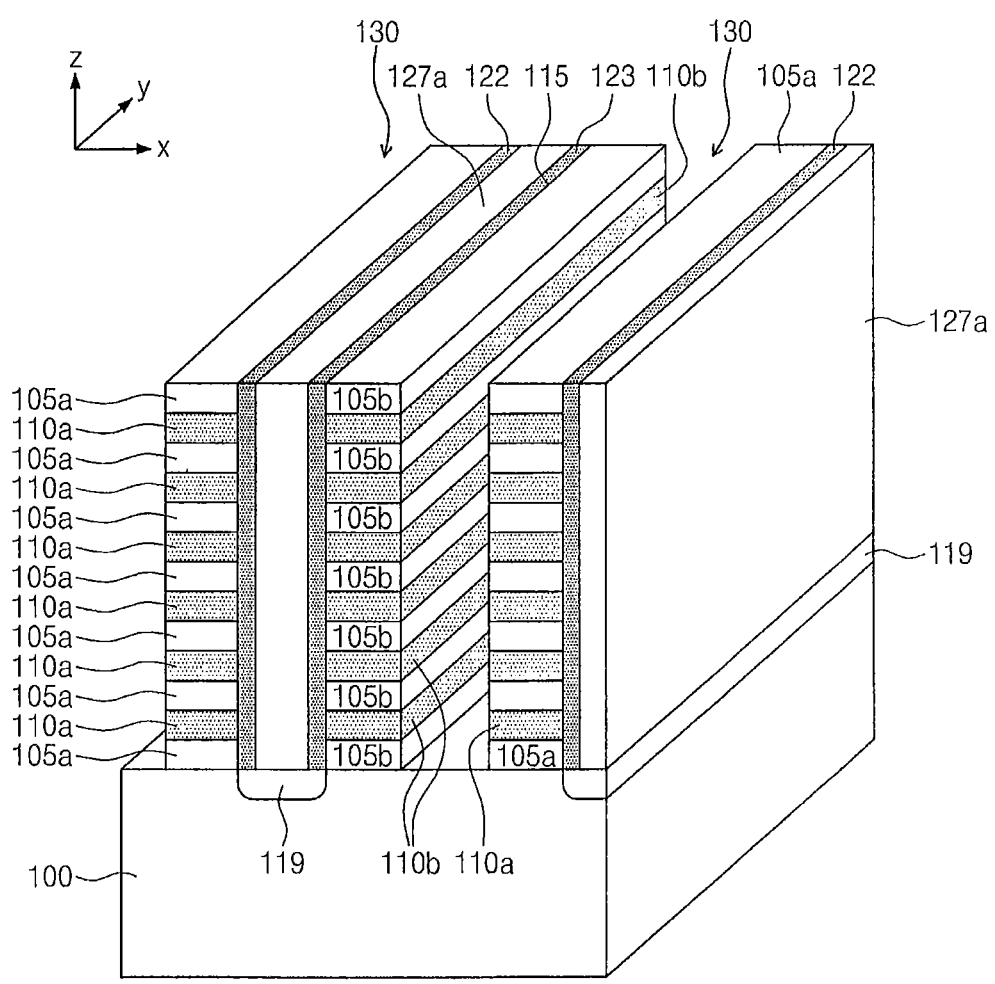

Referring to FIG. 4D, the dielectric layer 105 and the sacrificial layers 110 may be continuously patterned to form trenches 130. The trenches 130 may be formed to extend in the first direction side by side. The trenches 130 and the grooves 115 may be alternately and repeatedly arranged in the second direction. By forming the trenches 130, a first pattern stack and a second pattern stack may be formed between a pair of the trenches adjacent to each other. The first pattern stack may include first dielectric patterns 105a and first sacrificial patterns 110a that are alternately and repeatedly stacked, and the second pattern stack may include second dielectric patterns 105b and second sacrificial patterns 110b that are alternately and repeatedly stacked. The groove 115 may be disposed between the first pattern stack and the second pattern stack. The first pattern stack may contact the first preliminary active portion 122, and the second pattern stack may contact the second preliminary active portion 123.

Each of the first dielectric patterns 105 and the first sacrificial patterns 110a that are alternately stacked may have both sidewalls extending in the first direction side by side. One sidewall of each of the first dielectric patterns 105a and the first sacrificial patterns 110a may contact the first preliminary active portion 122, and the other sidewall thereof may be exposed to one of the trenches 130. Similarly, each of the second dielectric patterns 105b and the second sacrificial patterns 110b that are alternately stacked may have both sidewalls extending in the first direction side by side. One sidewall of each of the second dielectric patterns 105b and the second sacrificial patterns 110b may contact the second preliminary active portion 123, and the other sidewall thereof may be exposed to another of the trenches 130.

Figure 4E:
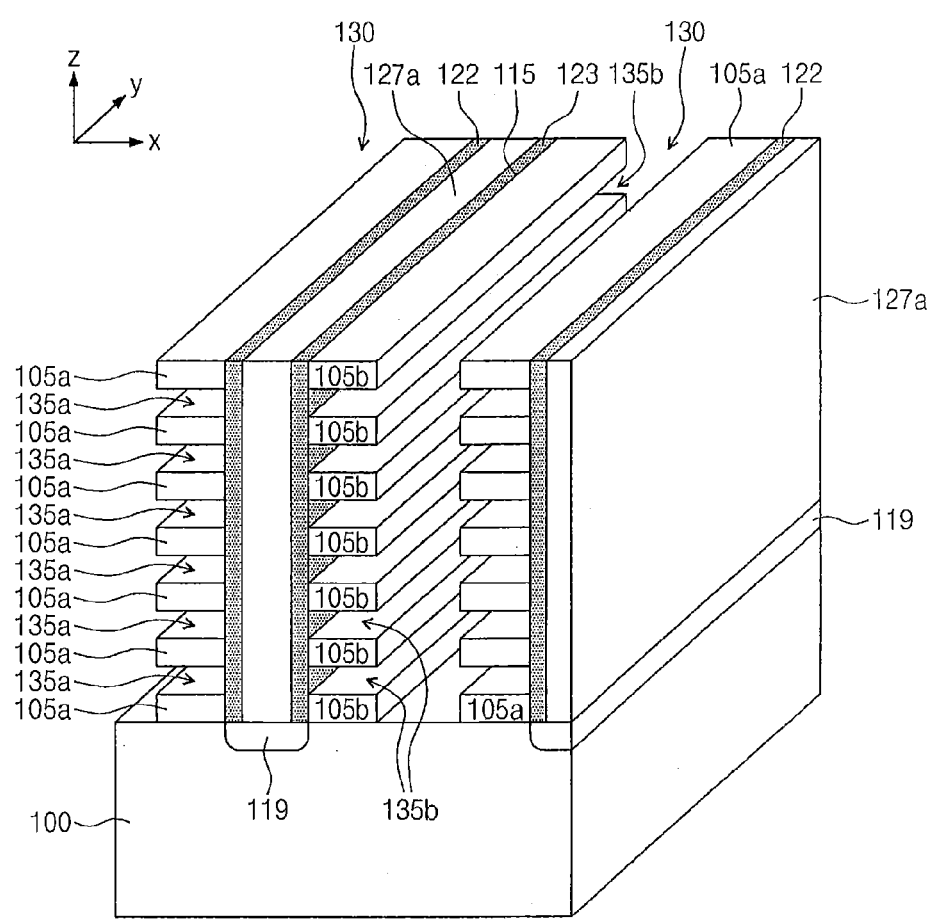

Referring to FIG. 4E, the first sacrificial patterns 110a and the second sacrificial patterns 110b exposed to the trenches 130 may be removed. In this case, the first and second dielectric patterns 105a and 105b may be supported and left by the preliminary active portions 122 and 123. Thus, first empty regions 135a and second empty regions 135b may be formed. The first empty regions 135a may be formed by removing the first sacrificial patterns 110a, and the second empty regions 135b may be formed by removing the second sacrificial patterns 110. The first and second sacrificial patterns 110a and 110b may be removed by an isotropic etching process.

Figure 4F:
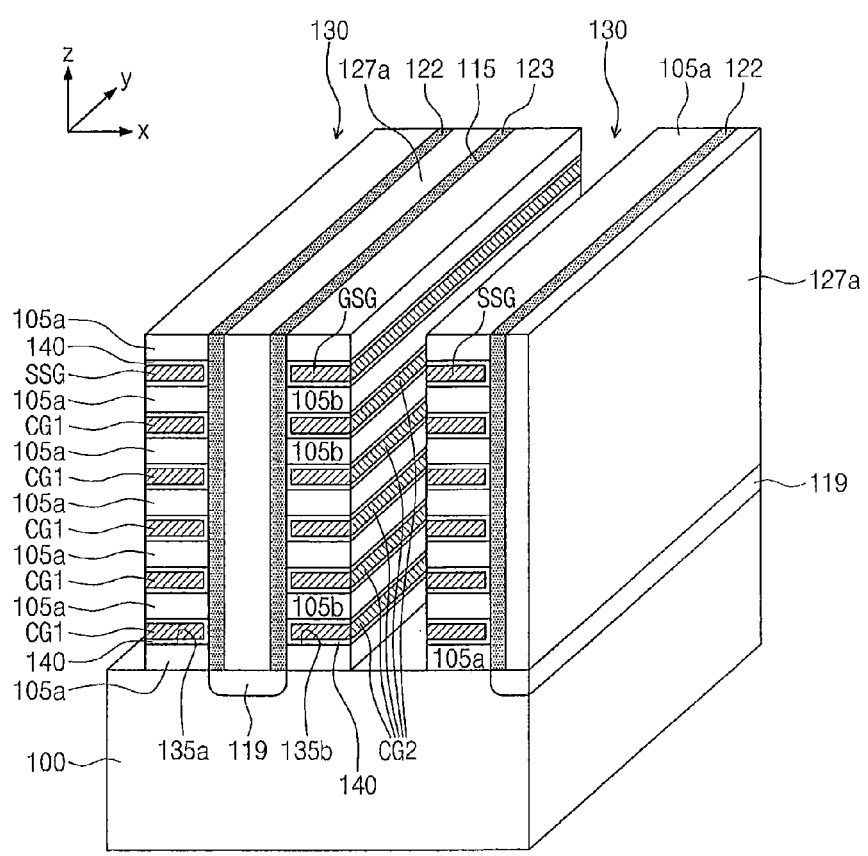

Referring to FIG. 4F, a gate dielectric layer 140 may be formed over the substrate 100 having the first and second empty regions 135a and 135b. The gate dielectric layer 140 may be formed to have the substantially uniform thickness along the inner surfaces of the first and second empty regions 135a and 135b. The gate dielectric layer 140 may also be formed on the sidewalls of the trench 130, top surfaces of the uppermost dielectric patterns, and the bottom surface of the trench 130. The gate dielectric layer 140 may include a tunnel dielectric layer, an information storage layer, and a blocking dielectric layer that are sequentially formed, as described with reference to FIG. 3. Next, a gate conductive layer may be formed over the substrate 100 to fill the first and second empty regions 135a and 135b. The gate conductive layer may fill a portion or the whole of the trenches 130. The gate conductive layer outside the first and second empty regions 135a and 135b may be removed. Thus, first gates CG1 and SSG may be formed in the first empty regions 135a, respectively, and second gates CG2 and GSG may be formed in the second empty regions 135b, respectively. As described with reference to FIGS. 1 and 2A, the first gates CG1 and SSG may include a plurality of first cell gates CGa1 being stacked and a string selection gate SSG over the uppermost first cell gate, and the second gates CG2 and GSG may include a plurality of second cell gates CG2 being stacked and a ground selection gate GSG over the uppermost second cell gate.

As shown in the drawing, the gate dielectric layer outside the first and second empty regions 135a and 135b may be removed. Otherwise, according to an embodiment of the inventive concept, the gate dielectric layer outside the first and second empty regions 135a and 135b may be left.

Figure 4G:
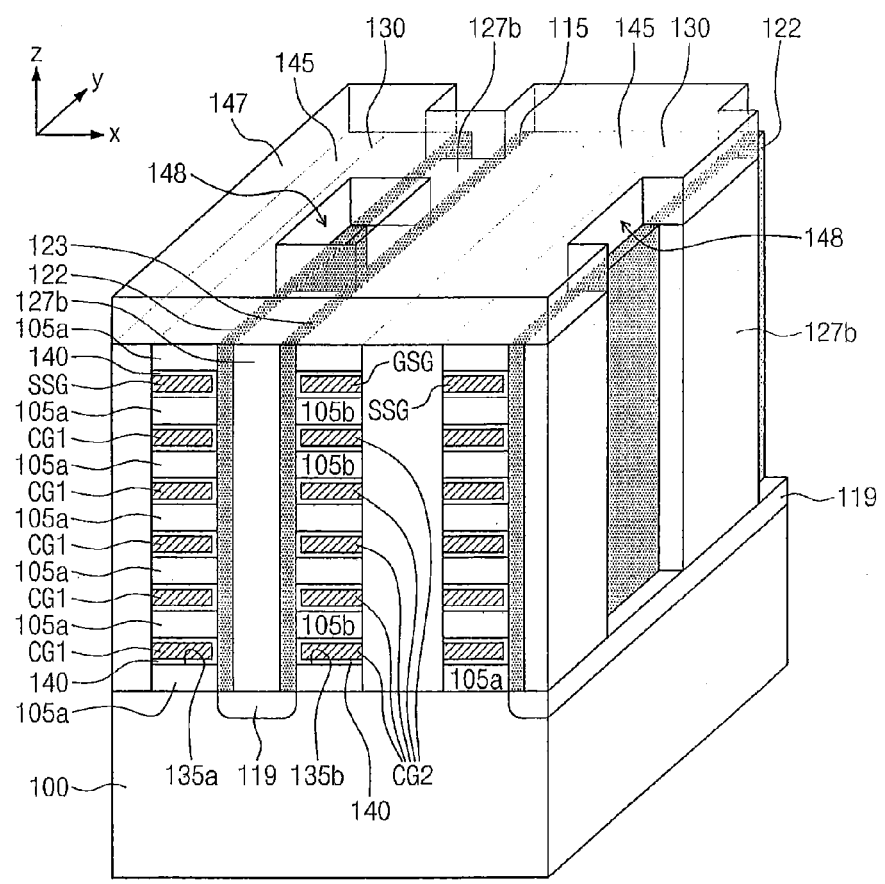

Referring to FIG. 4G, device isolation patterns 145 may be formed to fill the trenches 130, respectively. For example, the device isolation pattern 145 may include oxide, nitride, and/or oxynitride.

Next, a mask pattern 147 may be formed over the substrate 100. The mask pattern 147 may include an opening 148 exposing a portion of the planarized first filling-dielectric layer 127a. The mask pattern 147 may include a plurality of openings 148 that are spaced from each other. The openings 148 may be two-dimensionally arranged along rows and columns from in plan view. The mask pattern 147 may cover the other portion of the planarized first filling-dielectric layer 127a. Also, the mask pattern 147 may cover the whole of the device isolation pattern 145 and the whole of the uppermost dielectric patterns.

The exposed first filling-dielectric layer 127a may be etched by using the mask pattern 147 as an etch mask. Thus, first filling-dielectric patterns 127b may be formed in the groove 115 to be spaced from each other in the first direction. Portions of the first and second preliminary active portions 122 and 123 located between the first filling-dielectric patterns 127b in the groove 115 may be exposed.

According to an embodiment of the inventive concept, when the planarized first filling-dielectric layer 127a is formed of a dielectric material having an etch selectivity with respect to the device isolation pattern 145 and the uppermost dielectric patterns, the mask pattern 147 may include mask lines extending in the second direction side by side. The mask lines may be spaced from each other in the first direction. A portion of the planarized first filling-dielectric layer 127a may be covered by the mask line, and the other portion of the planarized first filling-dielectric layer 127a located between the mask lines may be exposed. In this case, the first filling-dielectric patterns 127b may be formed by etching the exposed first filling-dielectric layer 127a using the mask lines, the uppermost dielectric patterns, and the device isolation pattern 145 as an etch mask.

Hereinafter, forming of the mask pattern 147 having the opening 148 will be described for convenience of explanation.

Figure 4H:
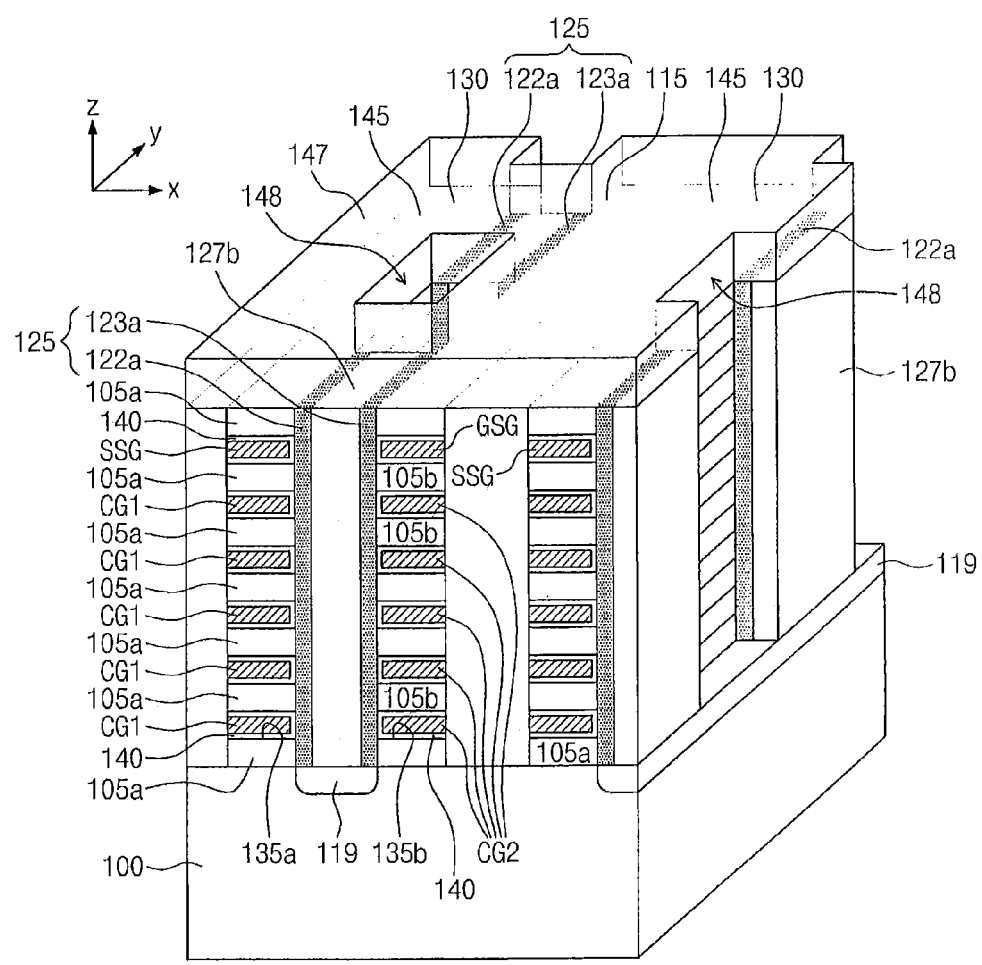

Referring to FIG. 4H, after the first filling-dielectric patterns 127b are formed, portions of the exposed first and second preliminary active portions 122 and 123 may be removed. Accordingly, active structures 125 may be formed in the groove 115. The active structure 125 may include a first vertical-type active portion 122a disposed between the first filling-dielectric pattern 127b and the first gates CG1 and SSG, and a second vertical-type active portion 123a disposed between the first filling-dielectric pattern 127b and the second gates CG2 and GSG.

When the portions of the exposed first and second preliminary active portions 122 and 123 are removed, the first filling-dielectric pattern 127b or the first filling-dielectric pattern 127b/the mask pattern 147 may be used as an etch mask. The portions of the exposed first and second preliminary active portions 122 and 123 may be removed by isotropic etching. When the portions of the exposed first and second preliminary active portions 122 and 123 are removed, the width of the first and second vertical-type active portions 122a and 123a in the first direction may be smaller than a width of the first filling-dielectric pattern 127b in the first direction.

Figure 4I:
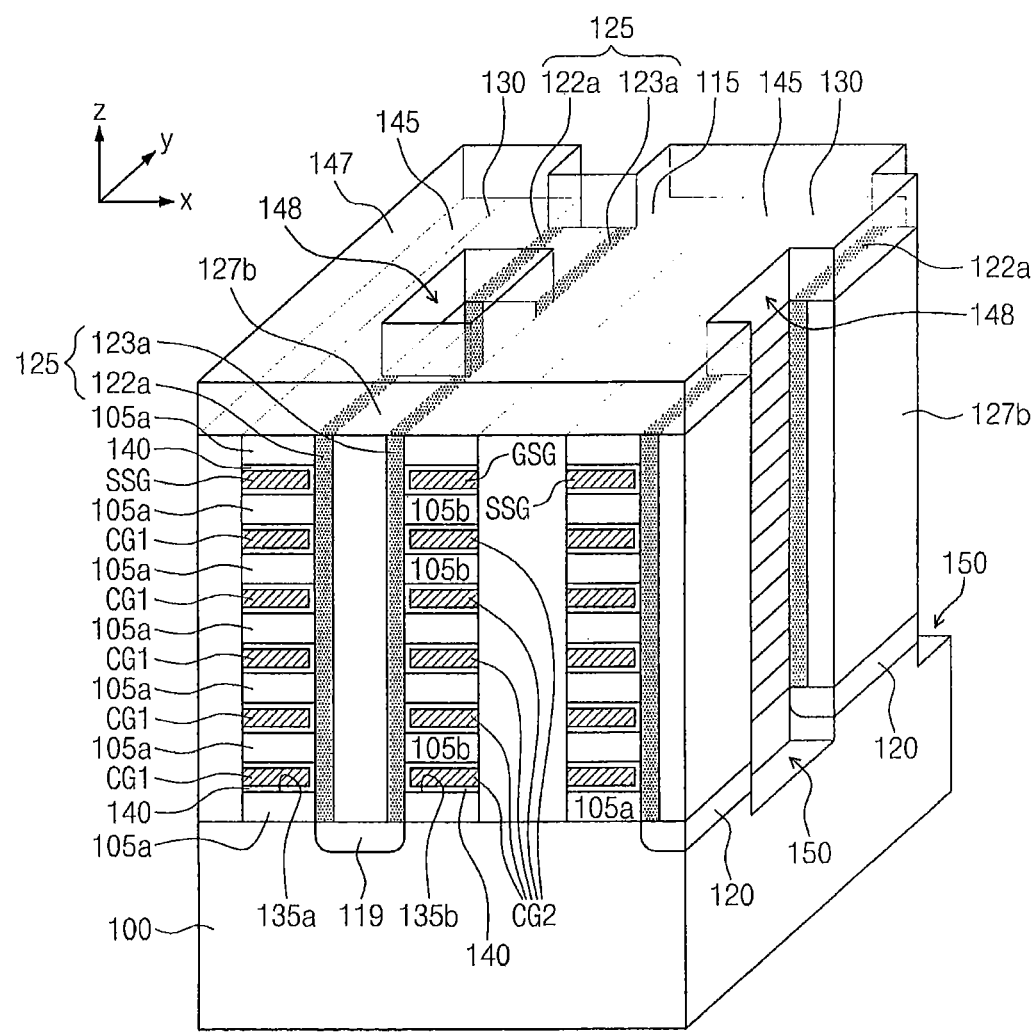

Referring to FIG. 4I, a portion of the preliminary doped region 119 located between the first filling-dielectric patterns 127b in the groove 115 may be etched to be removed. Accordingly, a recess region 150 may be formed, and a conjunction doped region 120 may be formed under the active structure 125 and the first filling-dielectric pattern 127b. The conjunction doped region 120 may correspond to a portion of the preliminary doped region 119. In other words, a plurality of conjunction doped regions 120 may be separated from each other by partially removing the preliminary doped region 119.

A portion of the preliminary doped region 119 may be removed by using the mask pattern 147 as an etch mask. The preliminary doped region 119 may be removed by an isotropic etching process and/or an anisotropic etching process. The bottom surface of the recess region 150 may be lower than the bottom surface of the conjunction doped region 120.

Figure 4J:
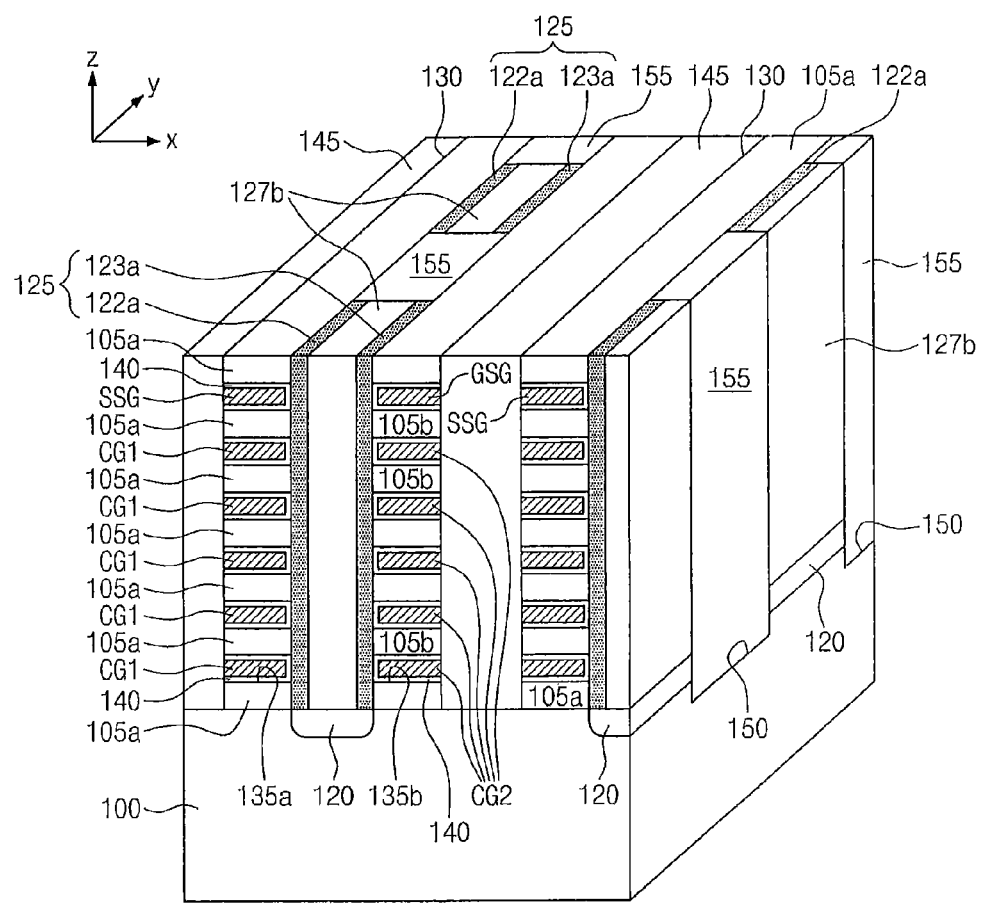

Referring to FIG. 4J, after the recess region 150 is formed, the mask pattern 147 may be removed. Next, a second filling-dielectric layer may be formed over the substrate 100. The second filling-dielectric layer may fill a space between the first filling-dielectric patterns 127b in the groove 115. Also, the second filling-dielectric layer may fill the recess region 150. In addition, the second filling-dielectric layer may contact the first and second dielectric patterns 105a and 105b on both sidewalls of the groove 115. The second filling-dielectric layer may be planarized to form second filling-dielectric patterns 155. The first filling-dielectric patterns 127b and the second filling-dielectric patterns 155 may be alternately and repeatedly arranged in the first direction in the groove 115. The second filling-dielectric pattern 155 may fill the space between the first filling-dielectric patterns 127b in the groove 115 and the recess region 150. Also, the second filling-dielectric pattern 155 may contact the sidewalls of the first and second dielectric patterns 105a and 105b forming both sidewalls of the groove 155.

Next, a pad conductive layer may be formed over the substrate 100 to contact the upper ends of the first and second vertical-type active portions 122a and 123a, and the pad conductive layer may be patterned to form the first and second conductive pads 160a and 160b of FIGS. 1 and 2A. Next, the first interlayer dielectric layer, the bit line plug 165, the bit line 170, the second interlayer dielectric, the source line plug 175, and the source line 180 may be formed as described with reference to FIGS. 1 and 2A. Thus, the three-dimensional semiconductor memory device described with reference to FIGS. 1 and 2A can be implemented.

On the other hand, according to the method for forming a three-dimensional semiconductor memory device, the active structure 125 may be formed after the gates CG1, SSG, CG2 and GSG and the device isolation pattern 145 are formed, but embodiments of the inventive concept are not limited thereto.

According to an embodiment of the inventive concept, after the active structure 125 is first formed, the trench 130, the gates CG1, SSG, CG2 and GSG, and the device isolation pattern 145 may be formed. For example, directly after the resultant of FIG. 4C are formed, a process for forming the first filling-dielectric patterns 127b using the mask pattern 147 of FIG. 4G, a process for forming the active structure, a process for forming the recess region 150, and a process for forming the second filling-dielectric patterns 155 may be sequentially performed.

Hereinafter, a method for forming the three-dimensional semiconductor memory device described with reference to FIG. 2B will be described. This method may be similar to the method for forming the three-dimensional semiconductor memory device described with reference to FIGS. 4A through 4J. Accordingly, description of this method will be focused on the characteristic parts thereof.

Figure 5A:
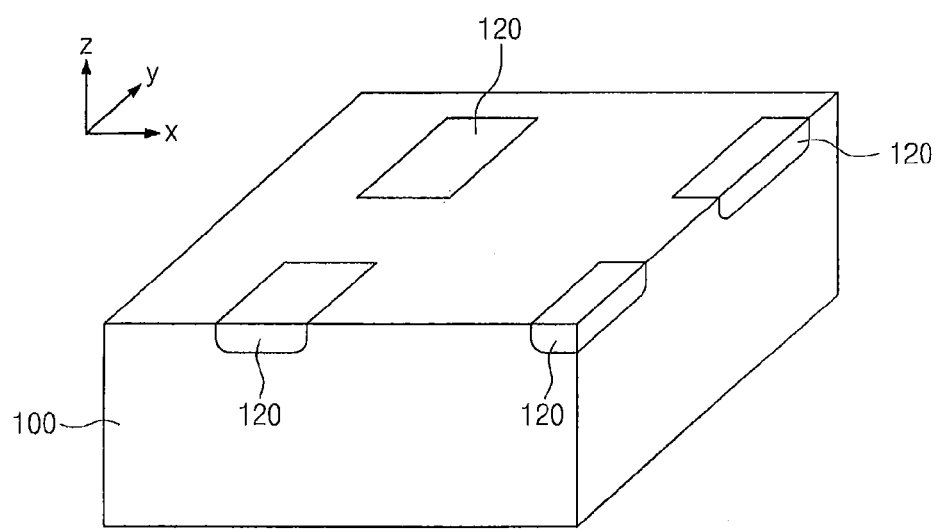
FIGS. 5A and 5B are perspective views illustrating a modified embodiment of a method for forming a three-dimensional semiconductor memory device according to an embodiment of the inventive concept.
Figure 5B:
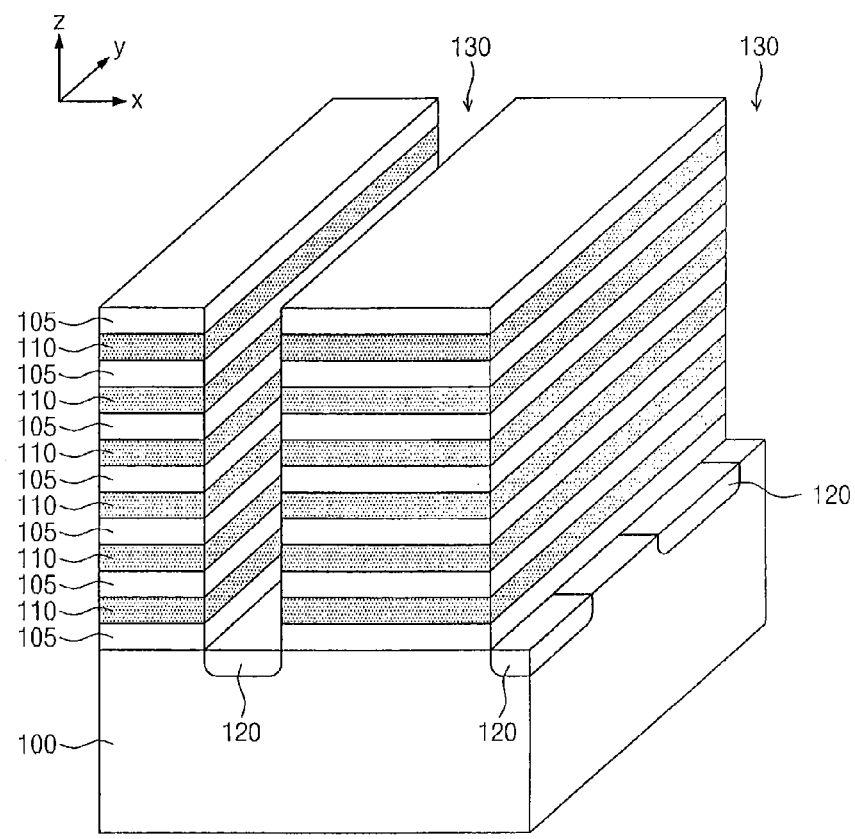

FIGS. 5A and 5B are perspective views illustrating a modified embodiment of a method for forming a three-dimensional semiconductor memory device according to an embodiment of the inventive concept.

Referring to FIG. 5a, conjunction doped regions 120 may be formed by selectively implanting second-type dopant ions into a substrate 100 doped with a first-type dopant. The conjunction doped regions 120 may be spaced from each other. Since the substrate 100 doped with the first-type dopant is disposed between the conjunction doped regions 120, the conjunction doped regions 120 may be electrically separated from each other. The conjunction doped regions 120 may be two-dimensionally arranged along rows and columns in plan view.

Referring to FIG. 5b, dielectric layers 105 and sacrificial layers 110 may be alternately and repeatedly stacked over the substrate 100 having the conjunction doped regions 120. The dielectric layers 105 and the sacrificial layers 110 may be continuously patterned to form grooves 130 extending in a first direction side by side. The first direction may correspond to the y-axis direction of the drawing. The grooves 130 may be arranged in the first direction to expose the conjunction doped regions 120 forming a column.

Next, the three-dimensional semiconductor memory device shown in FIG. 2B may be implemented by performing the same methods as the methods described with reference to FIGS. 4C through 4H, and 4J. In this modified embodiment, it may be not necessary to form the recess region 150 described with reference to FIG. 4I.

Next, the main features of a method for forming the three-dimensional semiconductor memory device shown in FIG. 2C will be described with reference to the accompanying drawings.

Figure 6A:
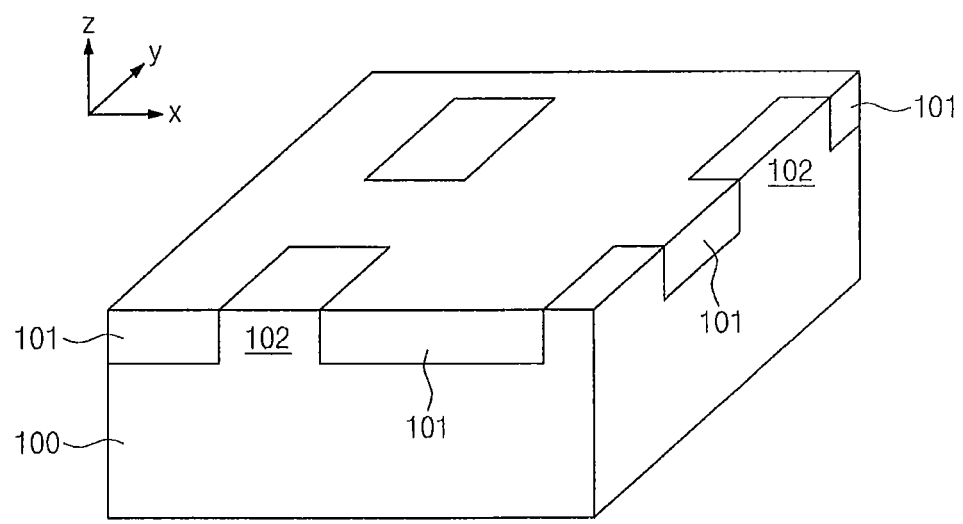
FIGS. 6A through 6C are perspective views illustrating another modified embodiment of a method for forming a three-dimensional semiconductor memory device according to an embodiment of the inventive concept.
Figure 6B:
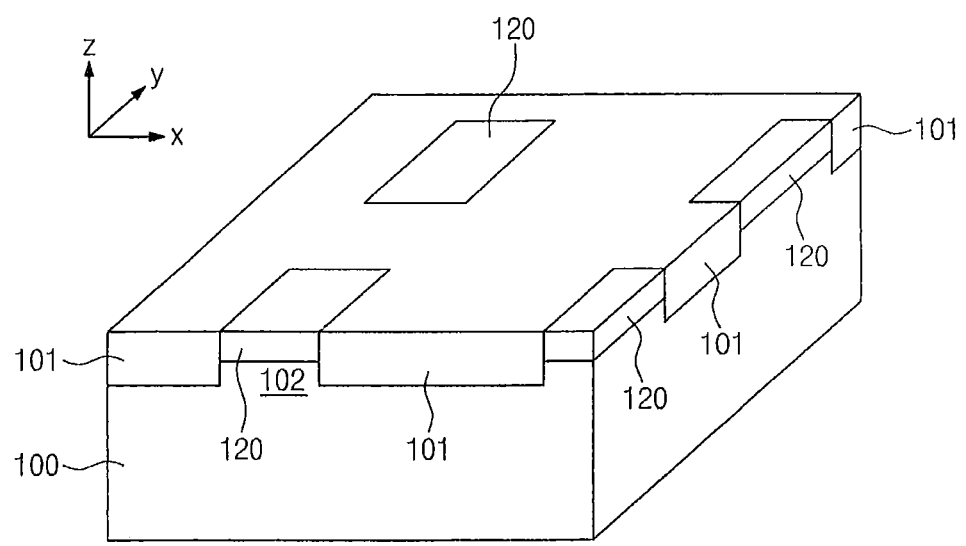
Figure 6C:
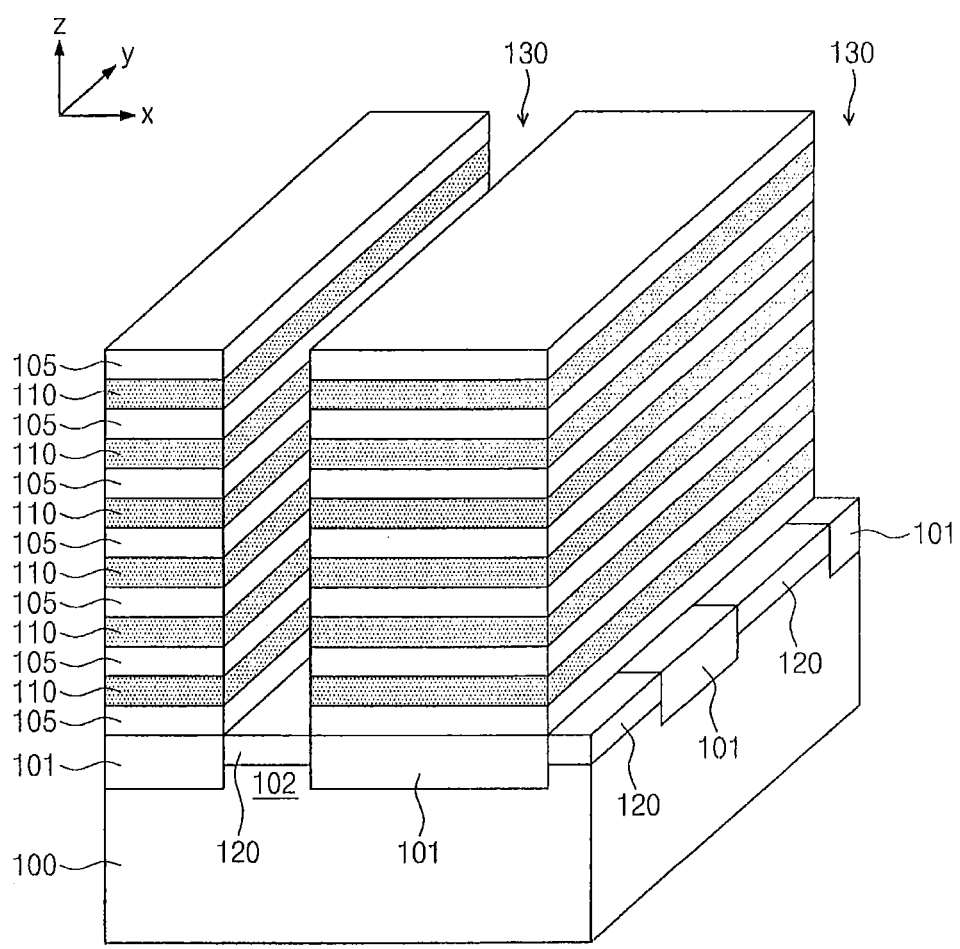

FIGS. 6A through 6C are perspective views illustrating another modified embodiment of a method for forming a three-dimensional semiconductor memory device according to an embodiment of the inventive concept.

Referring to FIG. 6A, a field dielectric pattern 101 may be formed in a substrate 100 doped with a first-type dopant to defined a base active portions 102. The base active portions 102 may correspond to a portion of the substrate 100 surrounded by the field dielectric pattern 101. The field dielectric pattern 101 may fill a base trench formed in the substrate 100. The base active portions 102 may be spaced from each other, and may be two-dimensionally arranged along rows and columns in plan view. The field dielectric pattern 101 may include oxide, nitride, and/or oxynitride.

Referring to FIG. 6B, conjunction doped regions 120 may be formed by implanting second-type dopant ions into the base active portions 102. The conjunction doped regions 120 may be formed in the base active portions 102, respectively.

Referring to FIG. 6C, dielectric layers 105 and sacrificial layer 110 may be alternately and repeatedly stacked over the substrate 100 having the field dielectric pattern 101 and the conjunction doped regions 120. The dielectric layers 105 and the sacrificial layers 110 may be continuously patterned to form grooves 130 extending in a first direction side by side. The grooves 130 may be arranged in the first direction to expose the conduction doped regions 120 forming a column and the field dielectric pattern 101 between the conjunction doped regions 120.

Next, the three-dimensional semiconductor memory device shown in FIG. 2C may be implemented by performing the same methods as the methods described with reference to FIGS. 4C through 4H, and 4J. In this modified embodiment, it may be not necessary to form the recess region 150 described with reference to FIG. 4I.

Figure 7A:
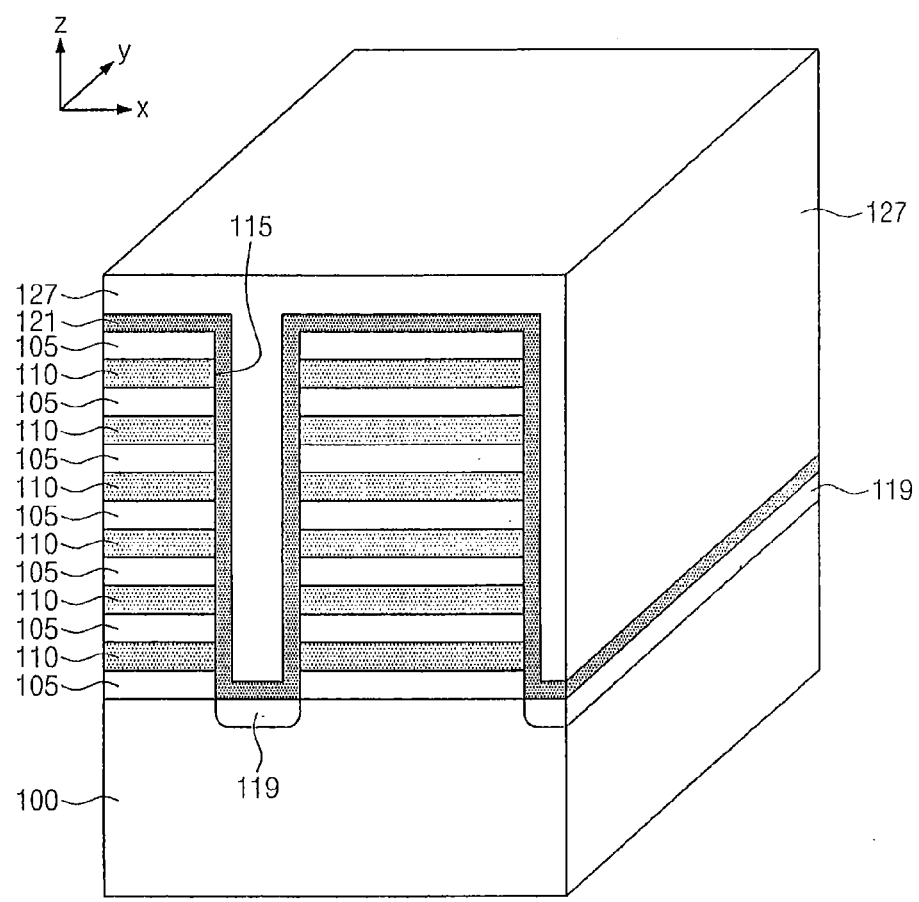
FIGS. 7A and 7B are perspective views illustrating still another modified embodiment of a method for forming a three-dimensional semiconductor memory device according to an embodiment of the inventive concept.
Figure 7B:
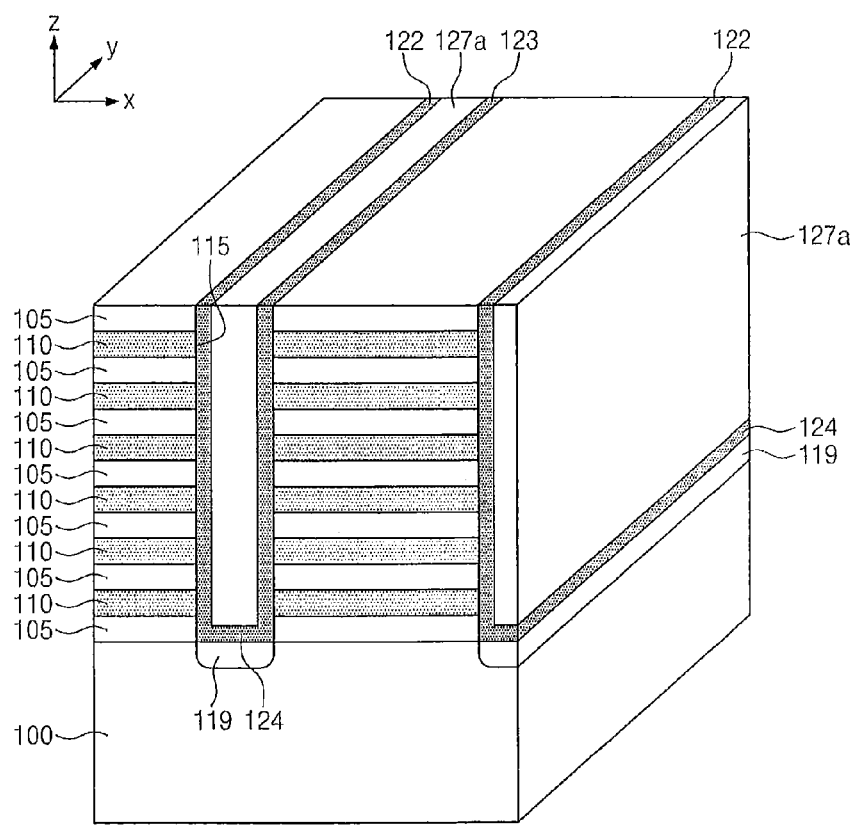

Next, the main features of a method for forming the three-dimensional semiconductor memory device shown in FIG. 2D will be described with reference to the accompanying drawings FIGS. 7A and 7B are perspective views illustrating still another modified embodiment of a method for forming a three-dimensional semiconductor memory device according to an embodiment of the inventive concept. The method for forming a three-dimensional semiconductor memory device according to this modified embodiment may include the methods described with reference to FIGS. 4A and 4B.

Referring to FIG. 7A, an active layer 121 may be conformally formed over a substrate 100 having a groove 115. The active layer 121 may be formed on both sidewalls and the bottom surface of the groove 115 to have a substantially uniform thickness. The active layer 121 may fill only a portion of the groove 115. A first filling-dielectric layer 127 may be formed on the active layer 121 to fill the groove 115.

Referring to FIG. 7B, the first filling-dielectric layer 127 and the active layer 121 may be planarized until the uppermost dielectric layer 105 is exposed, thereby forming a preliminary active structure and a planarized first filling-dielectric layer 127a in the groove 115. The preliminary active structure may include a first preliminary active portion 122 contacting a first sidewall of the groove 115, a second preliminary active portion 123 contacting a second sidewall of the groove 115, and a preliminary planar portion 124 disposed between the bottom surface of the groove 115 and the planarized first filling-dielectric layer 127a. The first preliminary active portion 122, the preliminary planar portion 124, and the second preliminary active portion 123 may form one body. Subsequent processes may be performed similarly to the processes described with reference to FIGS. 4D through 4J.

The methods described with reference to FIGS. 7A and 7B may be applied to the methods for forming a three-dimensional semiconductor memory device, described with reference to FIGS. 5A and 5B, and/or 6A through 6C.

Second Embodiment

Figure 8:
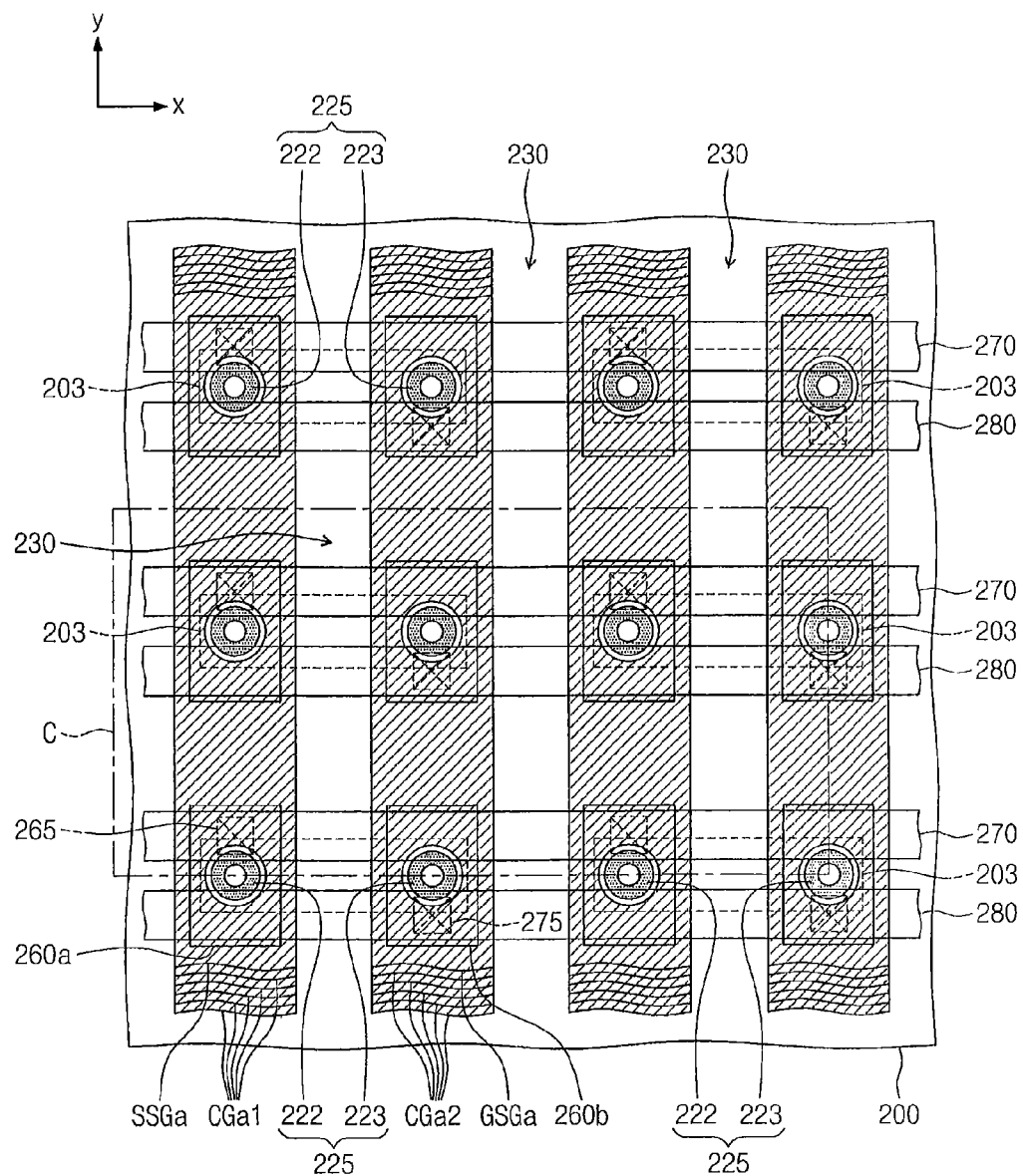
FIG. 8 is a plan view illustrating a three-dimensional semiconductor memory device according to another embodiment of the inventive concept.
Figure 9A:
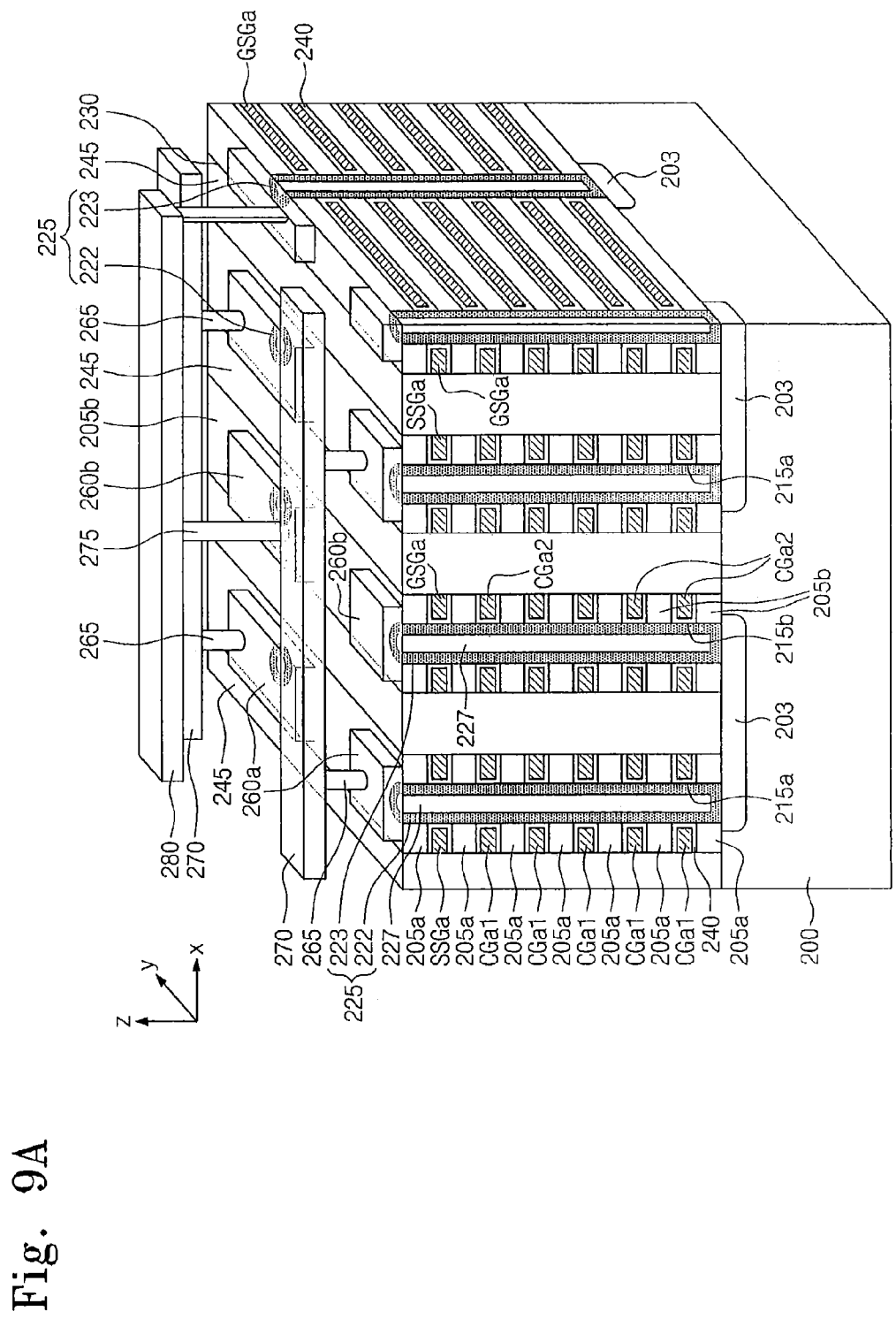
FIG. 9A is a perspective view illustrating a portion C of FIG. 8.

FIG. 8 is a plan view illustrating a three-dimensional semiconductor memory device according to another embodiment of the inventive concept. FIG. 9A is a perspective view illustrating a portion C of FIG. 8.

Referring to FIGS. 8 and 9A, a first gate stack and a second gate stack on a substrate 200 may extend in a first direction side by side. The substrate 200 may be a silicon substrate, a germanium substrate, or a silicon-germanium substrate. The substrate 200 may be doped with a first-type dopant. The first gate stack may include a first dielectric pattern 205a and first gates CGa1 and SSGa that are alternately and repeatedly stacked, and the second gate stack may include a second dielectric pattern 205b and second gates CGa2 and GSGa that are alternately and repeatedly stacked over the substrate 200 at one side of the first gate stack.

The first gates CGa1 and SSGa included in the first gate stack may include a plurality of first cell gates CGa1 being stacked and a string selection gate SSGa disposed over the uppermost first cell gate. The lowermost first gate among the first gates CGa1 and SSGa including in the first gate stack may be the lowermost first cell gate CGa1. The second gates CGa2 and GSGa included in the second gate stack may include a plurality of second cell gates CGa2 being stacked and a ground selection gate GSGa stacked over the uppermost second cell gate. The lowermost second gate among the second gates CGa2 and GSGa included in the second gate stack may be the lowermost second cell gate CGa2. The first and second gates CGa1, SSGa, CGa2 and GSGa may be formed of the same material as the gates CG1, SSG, CG2 and GSG described in the first embodiment. The dielectric patterns 205a and 205b may be formed of the same material as the dielectric patterns 105a and 105b described in the first embodiment, and may have the same characteristics (e.g., thickness and/or location) as the dielectric patterns 105a and 105b described in the first embodiment.

According to an embodiment of the inventive concept, the first gates CGa1 and SSGa may include a plurality of string selection gates SSGa stacked over the uppermost first cell gate. Similarly, the second gates CGa2 and GSGa may include one ground selection gate GSG disposed over the uppermost second cell gate, or may include a plurality of ground selection gate GSGa stacked over the uppermost second cell gate.

The first and second gate stacks may be configured with one gate stack group. The gate stack group may be provided in plurality over the substrate 200. The plurality of the gate stack groups may extend in the first direction side by side. The gate stack groups may be spaced from each other in a second direction perpendicular to the first direction. The first direction may correspond to the y-axis direction and the second direction may correspond to the x-axis direction in FIGS. 8 and 9A. Trenches 230 may be defined between the first and second gate stacks in each of the stack groups and between the gate stack groups, respectively.

Conjunction doped regions 203 doped with a second-type dopant may be disposed in the substrate 200. The conjunction doped regions 203 may be two-dimensionally arranged along rows and columns in plan view. The conjunction doped regions 203 may be spaced from each other. The substrate 200 doped with the first-type dopant may be disposed between the conjunction doped regions 203. Thus, the conjunction doped regions 203 may be electrically separated. The conjunction doped regions 203 may have rectangular top surfaces extending in the second direction. The conjunction doped region 203 may include edge portions overlapping the first and second gate stacks in each of the gate stack groups, and a central portion located between the first and second gate stacks. The conjunction doped region 203 may not be provided between the gate stack groups.

A first vertical-type active portion 222 may be connected to one edge portion of the conjunction doped region 203 through the first dielectric patterns 205a and the first gates CGa1 and SSGa in the first gate stack, and a second vertical-type active portion 223 may be connected to the other edge portion of the conjunction doped region 203 through the second dielectric pattern 205b and the second gates CGa2 and GSGa in the second gate stack. The first vertical-type active portion 222 may be disposed in a first channel hole 215a penetrating the first dielectric patterns 205a and the first gates CGa1 and SSGa that are alternately stacked, and the second vertical-type active portion 223 may be disposed in a second channel hole 215b penetrating the second dielectric patterns 205b and the second gates CGa2 and GSGa that are alternately stacked. The first and second vertical-type active portions 222 and 223 may contact both edge portions of the conjunction doped region 203, respectively. The first and second vertical-type active portions 222 and 223 may be included in the active structure 225. The first gates CGa1 and SSGa may have sidewalls surrounding the first vertical-type active portion 222, respectively. The first vertical-type active portion 222 may overlap the surrounding sidewalls of the first gates CGa1 and SSGa. Similarly, the second gates CGa2 and SSGa may have sidewalls surrounding the second vertical-type active portion 223, respectively. And the second vertical type active portion 223 may overlap the surrounding sidewalls of the second gates CGa2 and GSGa.

The first and second vertical-type active portions 222 and 223 may have a pipe shape or macaroni shape. In this case, the first and second vertical-type active portions 222 and 223 may be filled with filling-dielectric patterns 227, respectively. Otherwise, according to an embodiment, the first and second vertical-type active portions 222 and 223 may be pillar-shaped. In this case, the filling-dielectric pattern 227 may be omitted. The first and second vertical-type active portions 222 and 223 may be formed of the same material as the first and second vertical-type active portions 222 and 223 described in the first embodiment. The first and second vertical-type active portions 222 and 223 may be doped with the first-type dopant, or may be undoped. The filling-dielectric pattern 227 may include oxide, nitride, and/or oxynitride.

A gate dielectric layer 240 may be disposed between the first vertical-type active portion 222 and the first gates CGa1 and SSGa, and between the second vertical-type active portion 223 and the second gates CGa2 and GSGa. The first vertical-type active portion 222 may contact the sidewalls of the first dielectric patterns 205a, surrounding the first vertical-type active portion 222. And the second vertical-type active portion 223 may contact the sidewalls of the second dielectric patterns 205b, surrounding the second vertical-type active portion 223. The gate dielectric layer 240 may be formed of the same material and triple layer as the gate dielectric layer 140 described with reference to FIGS. 2A and 3 according to the first embodiment.

The first vertical-type active portion 222, the first cell gate CGa1, and the gate dielectric layer 240 therebetween may form a first cell transistor, and the first vertical-type active portion 222, the string selection gate SSGa, and the gate dielectric layer 240 therebetween may form a string selection transistor. Also, the second vertical-type active portion 223, the second cell gate CGa2, and the gate dielectric layer 240 therebetween may form a second cell transistor, and the second vertical-type active portion 223, the ground selection gate GSGa, and the gate dielectric layer 240 therebetween may form a ground selection transistor.

Due to the first gates CGa1 and SSGa of the first gate stack, and the first vertical-type active portion 222, a plurality of the first cell transistors and the string selection transistor may be sequentially stacked, and may be connected in series to each other. Similarly, due to the second gates CGa2 and GSGa of the second gate stack, and the second vertical-type active portion 223, a plurality of the second cell transistors and the ground selection transistor may be sequentially stacked, and may be connected in series to each other. Since the conjunction doped region 203 is connected to lower ends of the first and second vertical-type active portions 222 and 223, the first cell transistor including the lowermost first cell gate CGa1 and the second cell transistor including the lowermost second cell gate CGa2 may be connected in series to each other. As a result, the conjunction doped region 203, the stacked first cell transistors and string selection transistor, and the stacked second cell transistors and ground selection transistor may form one cell string. The cell string may have a "U" shape on the x-z plane.

A plurality of the active structures 225 may penetrate the first and second gate stacks in each of the gate stack groups. The first and second vertical-type active portions 222 and 223 in each of the active structures 225 may contact both edge portions of each of the conjunction doped regions 203. Thus, a plurality of cell strings having a "U" shape may be implemented in the gate stack groups, respectively.

Device isolation patterns 245 may fill the trenches 230. The device isolation pattern 245 may include oxide, nitride, and/or oxynitride. A first conductive pad 260a may contact the upper end of the first vertical-type active portion 222, and a second conductive pad 260b may contact the upper end of the second vertical-type active portion 223. The first and second conductive pads 260a and 260b may be formed of the same material as the first and second conductive pads 160a and 160b of the first embodiment described above. A bit line 270 may be electrically connected to the upper end of the first vertical-type active portion 222, and a source line 280 may be electrically connected to the upper end of the second vertical-type active portion 223. The bit line 270 may be electrically connected to the upper end of the first vertical-type active portion 222 via a bit line plug 265 connected to the first conductive pad 260a and the first conductive pad 260a. The source line 280 may be electrically connected to the upper end of the second vertical-type active portion 223 via a source line plug 275 connected to the second conductive pad 260b and the second conductive pad 260b. The bit line 270 and the source line 280 may be located at different levels with respect to the top surface of the substrate 100. According to an embodiment, the source line 280 may be located higher than the bit line 270. In contrast, the bit line 270 may be located higher than the source line. Otherwise, the source line 280 and the bit line 270 may be located at the same level, and may be laterally spaced from each other. The bit line 270 and the source line 280 may be formed of the same material as the bit line 170 and the source line 180 of the first embodiment described above. The bit line plug 265 and the source line plug 275 may be formed of the same material as the bit line plug 165 and the source line plug 175 of the first embodiment described above.

According to the three-dimensional semiconductor memory device, the cell string may include the stacked first cell gates CGa2 and string selection gate SSGa, the stacked second cell gates CGa2 and ground selection gate GSGa, the first and second vertical-type active portions 222 and 223, and the conjunction doped region 203. Thus, the cell string may be implemented in a "U" shape. Therefore, the source line 280, to which a reference voltage is applied, may be formed of a conductive material having a low resistivity. As a result, a three-dimensional semiconductor memory device having excellent reliability can be implemented. Also, a three-dimensional semiconductor memory device capable of operating at a high speed can be implemented.

On the other hand, the conjunction doped regions 203 may be electrically separated from each other by other methods, which will be described with reference to the accompany drawings.

Figure 9B:
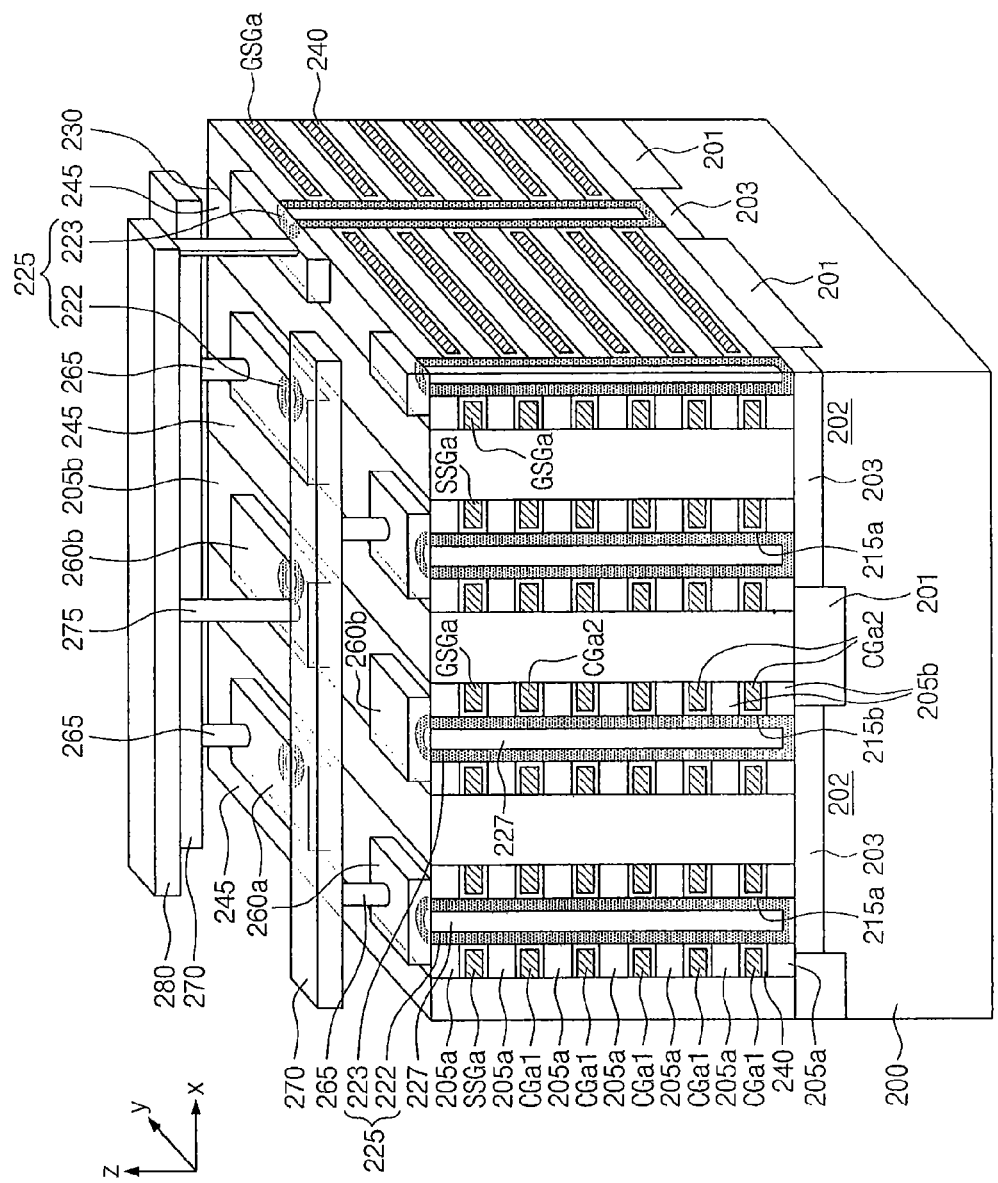
FIG. 9B is a cross-sectional view illustrating a modified embodiment of a three-dimensional semiconductor memory device according to another embodiment of the inventive concept.

FIG. 9B is a cross-sectional view illustrating a modified embodiment of a three-dimensional semiconductor memory device according to another embodiment of the inventive concept.

Referring to FIG. 9B, a field dielectric pattern 201 may disposed in the substrate 200 to define base active portions 202. The base active portions 202 may be spaced from each other. The field dielectric pattern 201 may have a pattern that fills a base trench formed in the substrate 200. The field dielectric pattern 201 may include oxide, nitride, and/or oxynitride. The conjunction doped regions 203 may be formed in the base active portions 202, respectively. Thus, the conjunction doped regions 203 may be electrically separated from each other by the field dielectric pattern 201.

FIGS. 10A through 10E are perspective views illustrating a method for forming a three-dimensional memory device according to another embodiment of the inventive concept.

Figure 10A:
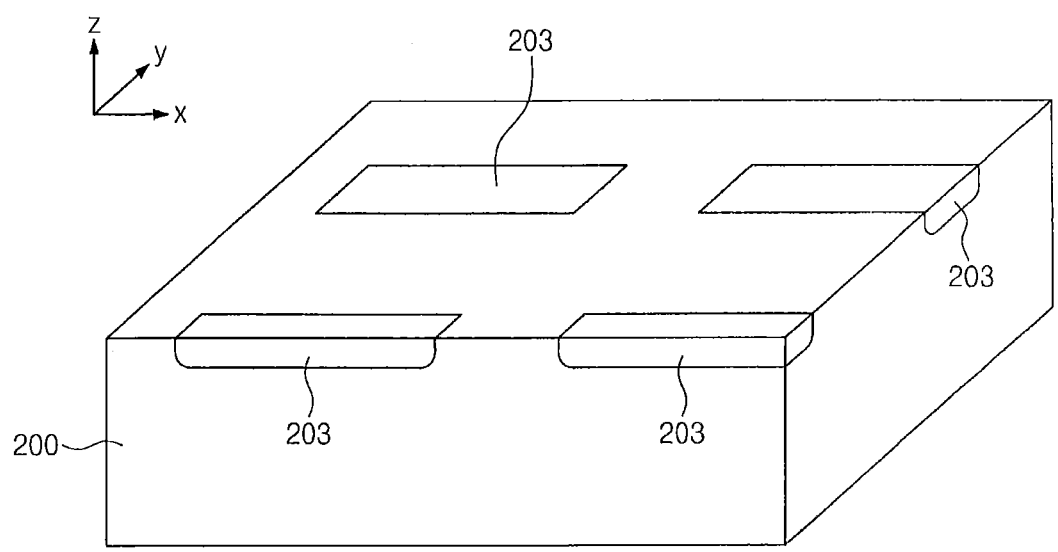
FIGS. 10A through 10E are perspective views illustrating a method for forming a three-dimensional memory device according to another embodiment of the inventive concept.

Referring to FIG. 10A, conduction doped regions 203 may be formed by selectively implanting second-type dopant ions into a substrate 200 doped with a first-type dopant. The second-type dopant may be selectively implanted into the substrate 200 using an ion implantation mask pattern. The conjunction doped regions 203 may be spaced from each other. Accordingly, the conjunction doped regions 203 may be electrically separated from each other, by disposing the substrate 200 doped with the first-type dopant between the conjunction doped regions 203.

Figure 10B:
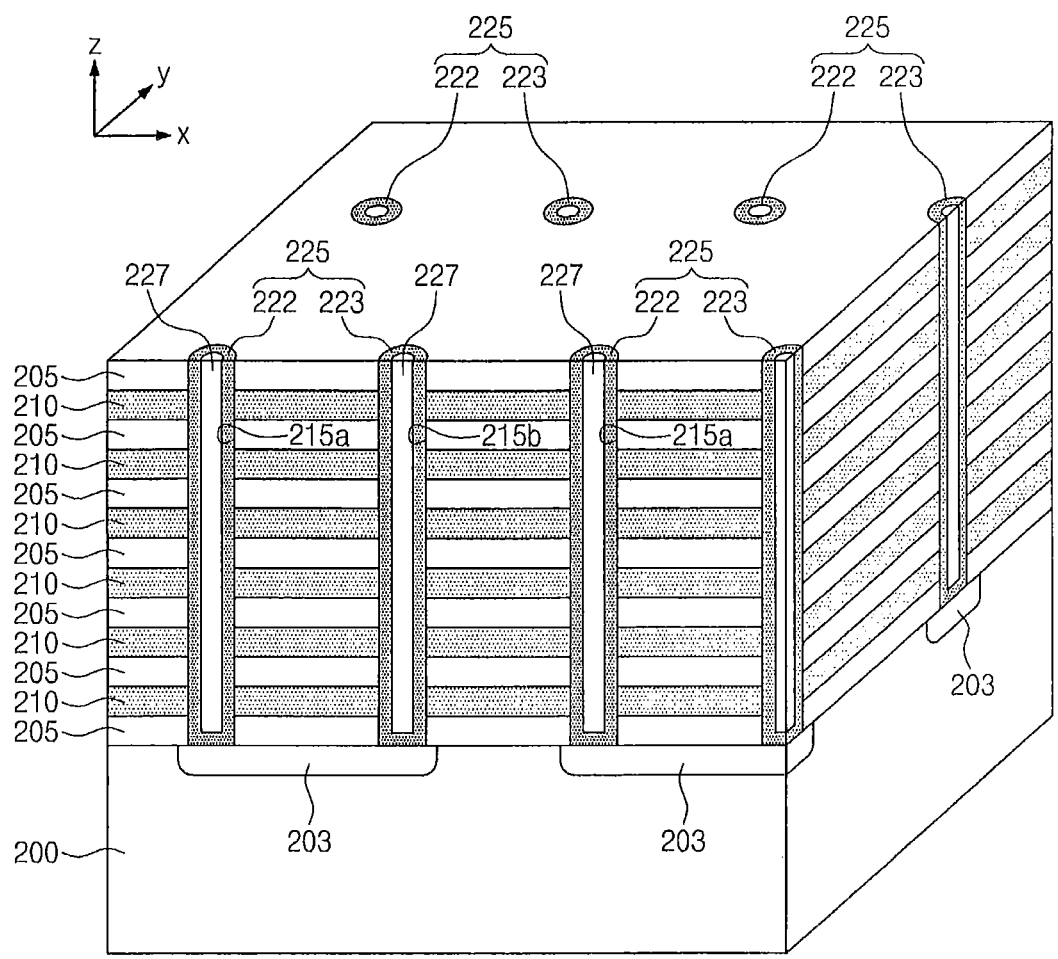

Referring to FIG. 10B, dielectric layers 205 and sacrificial layer 210 may be alternately and repeatedly stacked over the substrate 200 having the conjunction doped regions 203. The alternately-stacked dielectric layers 205 and sacrificial layers 210 may be continuously patterned to form first channel holes 215a and second channel holes 215b. The first channel hole 215a may expose one edge portion of the conjunction doped region 203, and the second channel hole 215b may expose the other edge portion of the conjunction doped region 203. One first channel hole 215a and one second channel hole 215b may be formed over one conjunction doped region 203.

An active layer may be conformally formed over the substrate 200 having the first and second channel holes 215a and 215b. The active layer may be formed on the sidewalls and the bottom surfaces of the first and second channel holes 215a and 215b to have a substantially uniform thickness. The active layer may fill a portion of the first and second channel holes 215a and 215b. A filling-dielectric layer may be formed over the active layer to fill the channel holes 215a and 215b. Next, the filling-dielectric layer and the active layer may be planarized until the uppermost dielectric layer 205 is exposed, and thereby, a first vertical-type active portion 222 and a filling-dielectric pattern 227 may be formed in the first channel hole 215a, and a second vertical-type active portion 223 and a filling-dielectric pattern 227 may be formed in the second channel hole 215b. The first and second vertical-type active portions 215a and 215b may contact the conjunction doped region 203. Also, the first and second vertical-type active portions 222 and 223 may contact the sidewall of the first channel hole 215a and the sidewall of the second channel hole 215b, respectively.

According to an embodiment of the inventive concept, the filling-dielectric layer may be omitted. In this case, the active layer may be formed to completely fill the first and second channel holes 215a and 215b. Thus, the first and second vertical active portions 222 and 223 may be formed to have pillar shapes filling the first and second channel holes 215a and 215b completely.

Figure 10C:
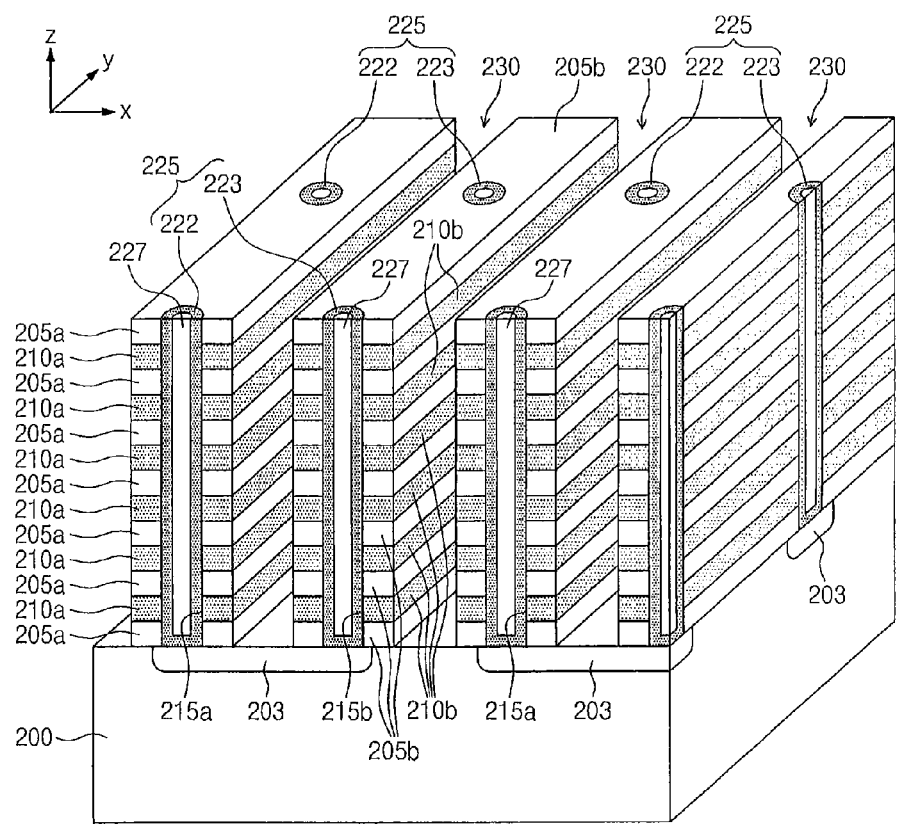

Referring to FIG. 10C, the dielectric layers 205 and the sacrificial layers 210 may be continuously patterned to form trenches 230 extending side by side in a first direction parallel to the top surface of the substrate 200. Accordingly, a first pattern stack and a second pattern stack may be formed over the substrate 200. The first pattern stack may include first dielectric patterns 205a and first sacrificial patterns 210a that are alternately stacked, and the second pattern stack may include second dielectric patterns 205b and first sacrificial patterns 210b that are alternately stacked. The first vertical-type active portion 222 may penetrate the first pattern stack, and the second vertical-type active portion 223 may penetrate the second pattern stack.

Figure 10D:
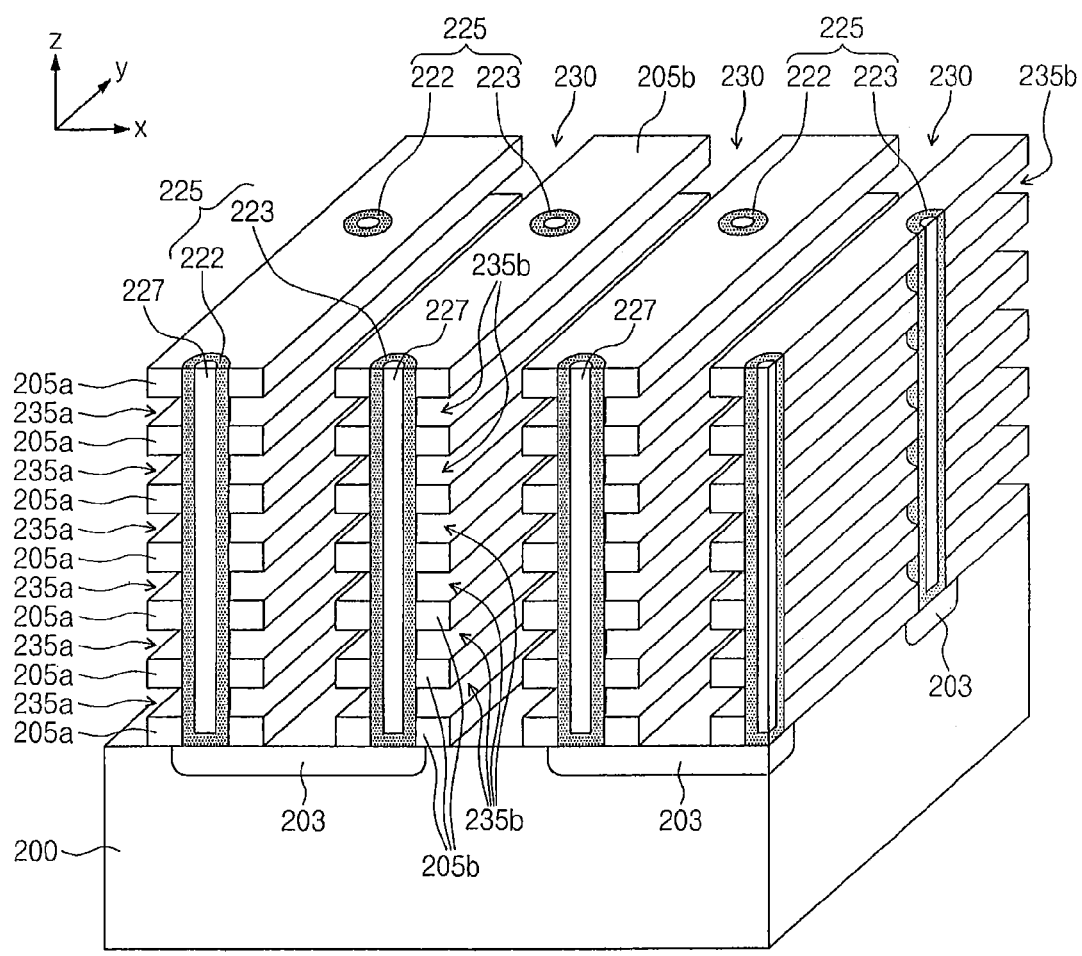

Referring to FIG. 10D, first empty regions 235a and second empty regions 235b may be formed by removing the first sacrificial patterns 210a and the second sacrificial patterns 210b. In this case, the first dielectric patterns 205a may be supported by the first vertical-type active portion 222, and the second dielectric patterns 205b may be supported by the second vertical-type active portion 223.

Figure 10E:
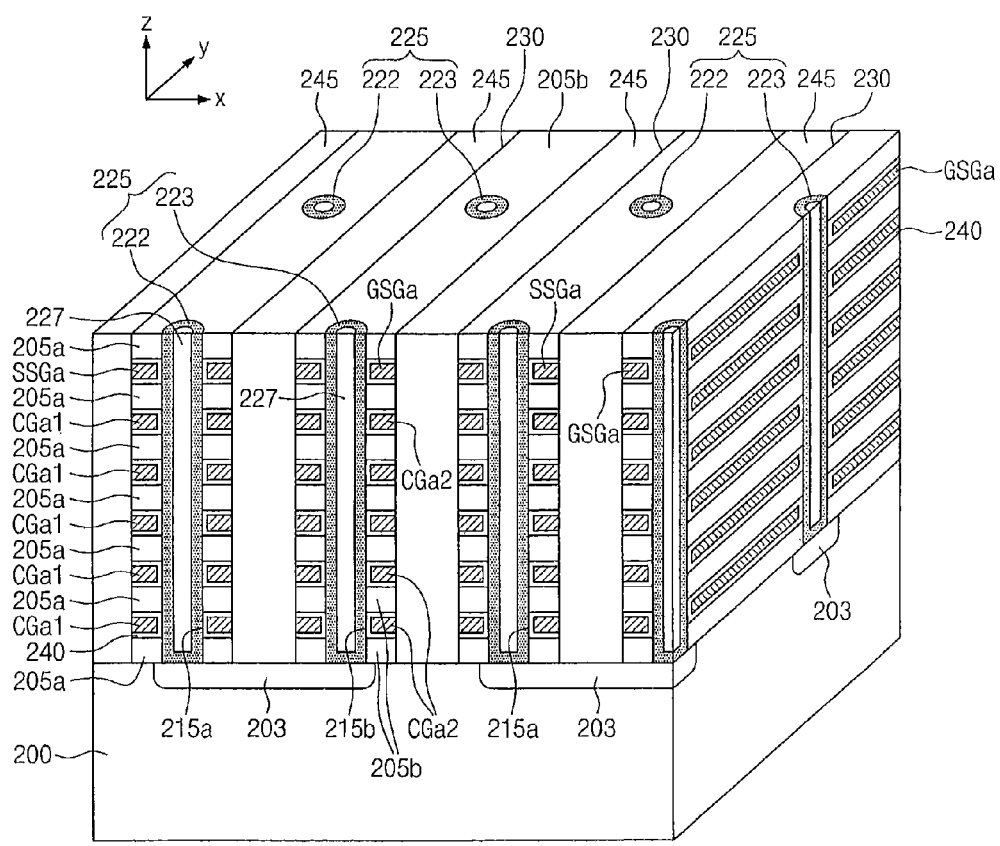

Referring to FIG. 10E, a gate dielectric layer 240 may be conformally formed over the substrate 200 having the first and second empty region 235a and 235b. The gate dielectric layer 240 may be formed to have a substantially uniform thickness on the inner surface of the first and second empty regions 235a and 235b. A gate conductive layer may be formed over the substrate 200 having the gate dielectric layer 240 to fill the first and second empty region 235a and 235b, and the gate conductive layer located at the outside of the first and second empty regions 235a and 235b may be removed to form gates CGa1, SSGa, CGa2 and GSGa. The first gates CGa1 and SSGa may be formed in the first empty regions 235a, respectively, and the second gates CGa2 and GSGa may be formed in the second empty regions 235b, respectively.

Next, a device isolation layer may be formed to fill the trenches 230, and then may be planarized to, form a device isolation layer 245 filling the trenches 230, respectively.

Next, the first and second conductive pads 260a and 260b, the interlayer dielectric, the bit line plug 265, the bit line 270, the source line plug 270, and the source line 280 shown in FIGS. 1 and 9A may be formed to implement the three-dimensional semiconductor memory device shown in FIGS. 1 and 9A.

Next, the main features of a method for forming the three-dimensional semiconductor memory device shown in FIG. 9B will be described with reference to the accompanying drawings.

Figure 11A:
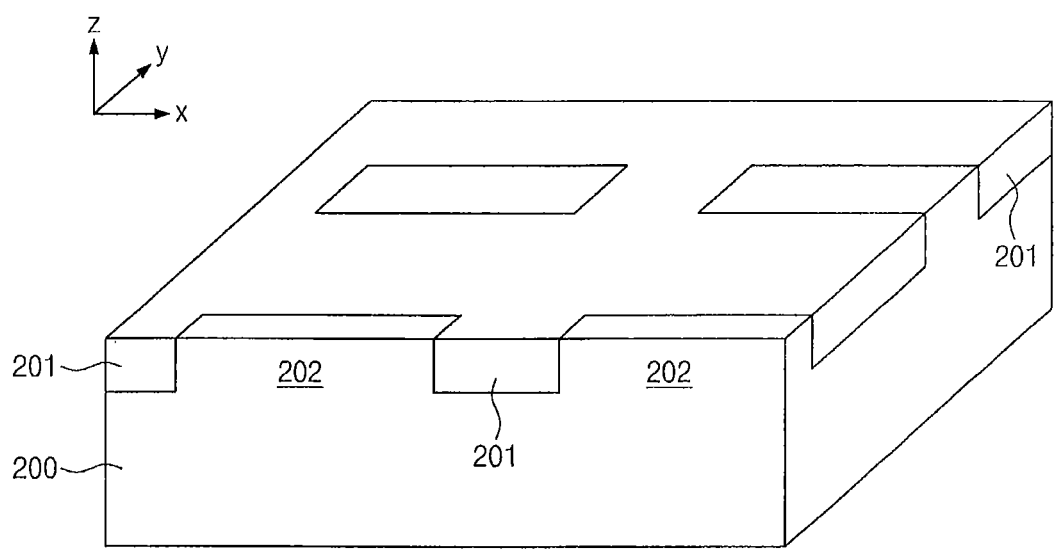
FIGS. 11A and 11B are perspective views illustrating a modified embodiment of a method for forming a three-dimensional semiconductor device according to another embodiment of the inventive concept.
Figure 11B:
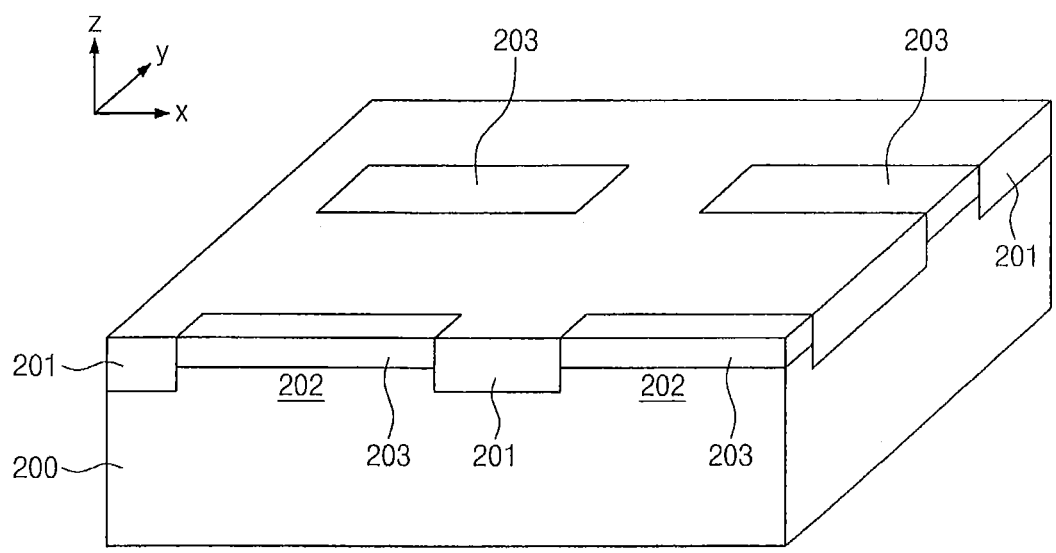

FIGS. 11A and 11B are perspective views illustrating a modified embodiment of a method for forming a three-dimensional semiconductor device according to another embodiment of the inventive concept.

Referring to FIGS. 11A and 11B, a field dielectric pattern 210 may be formed in a substrate 200 doped with a first-type dopant to define a base active portions 202. The base active portions 202 may be spaced from each other. Second-type dopant ions may be implanted into the base active portions 202 to form conjunction doped regions 203. The conjunction doped regions 203 may be formed in the base active portion 202, respectively. Subsequent processes may be performed similarly to the method described with reference to FIGS. 10B through 10E. Thus, the three-dimensional semiconductor memory device shown in FIG. 9B can be implemented.

The three-dimensional semiconductor memory devices disclosed in the embodiments described above may be mounted in various types of semiconductor packages. For example, the three-dimensional semiconductor memory devices according embodiments of the inventive concept may be packaged using various methods such as Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP). Packages mounted with the three-dimensional semiconductor memory devices according to embodiments of the inventive concept may further include a logic device and/or a controller for controlling the three-dimensional semiconductor memory device.

Figure 12:
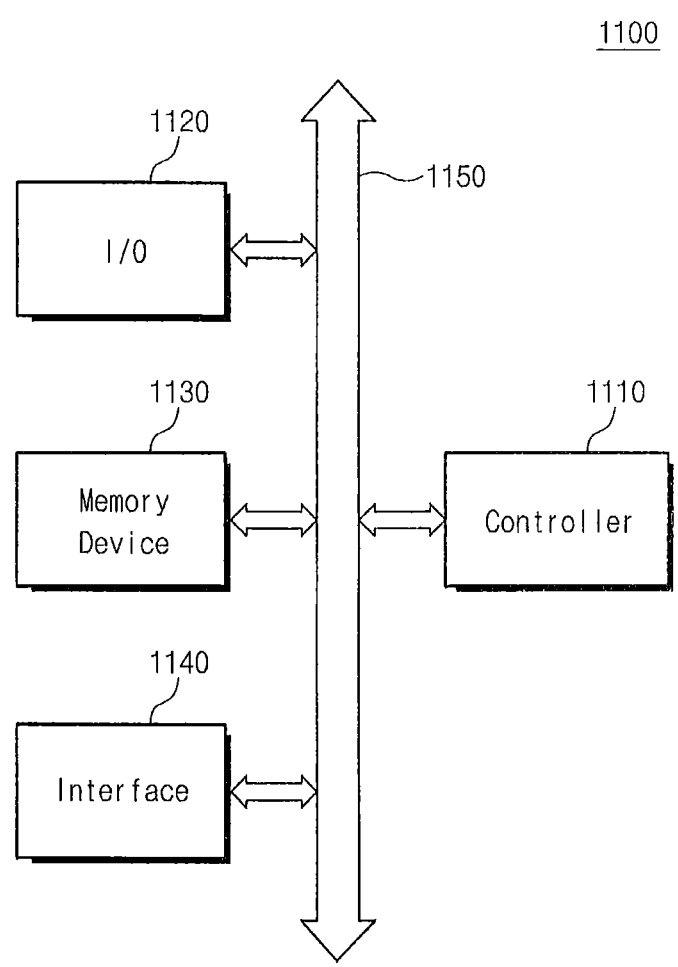
FIG. 12 is a block diagram illustrating an exemplary electronic system including a three-dimensional semiconductor memory device based on the technical spirit of the inventive concept.

FIG. 12 is a block diagram illustrating an exemplary electronic system including a three-dimensional semiconductor memory device based on the technical spirit of the inventive concept.

Referring to FIG. 12, an electronic system 1100 according to an embodiment of the inventive concept may include a controller 1110, an input/output (I/O) device 1120, a memory device 1130, an interface 1140, and a bus 1150. The controller 1110, the input/output device 1120, the memory device 1130 and/or the interface 1140 may be connected to one another through the bus 1150. The bus 1150 may serve as a path through which data is transmitted.

The controller 1110 may include at least one selected from the group consisting of a microprocessor, a digital signal processor, a microcontroller, and logic devices capable of performing similar functions to the above elements. The input/output device 1120 may include a keypad, a keyboard, a display device and the like. The memory device 1130 may store data and/or commands. The memory device 1130 may include at least one of the three-dimensional semiconductor memory devices disclosed in the embodiments described above. Also, the memory device 1130 may further include other types of semiconductor memory devices (e.g., DRAM device and/or SRAM device). The interface 1140 may serve to transmit/receive data to/from a communication network. The interface 1140 may include a wired and/or wireless interface. For example, the interface 1140 may include an antenna and/or a wired/wireless transceiver. Although not shown in the drawings, the electronic system 1100 may further include a high speed DRAM device and/or SRAM device as a working memory device for enhancing operations of the controller 1110.

The electronic system 1100 may be applied to a personal digital assistant (PDA), a portable computer, a web tablet, a wireless phone, a mobile phone, a digital music player, a memory card, or all electronic products capable of transmitting/receiving information in a wireless environment.

Figure 13:
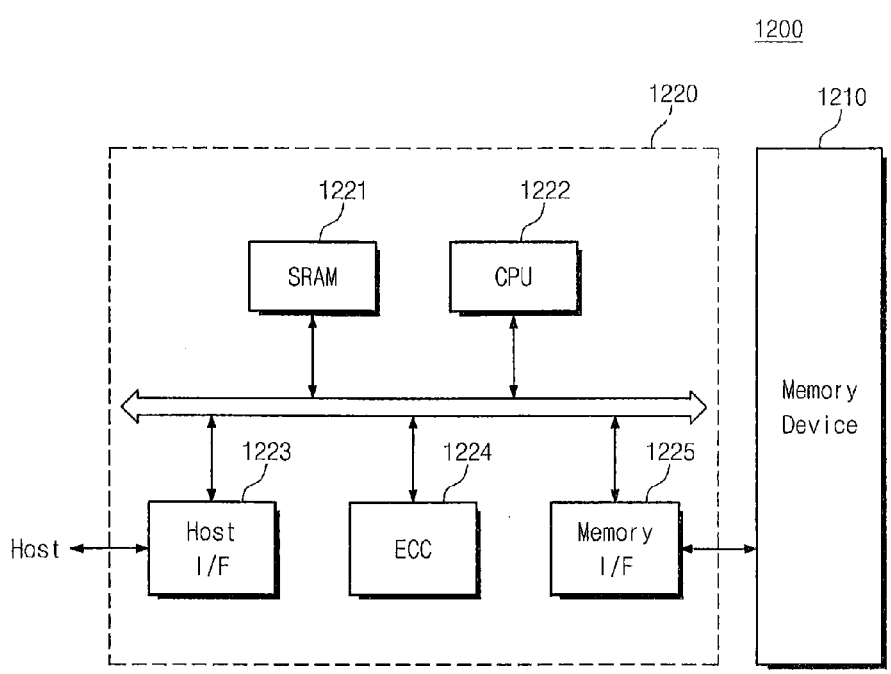
FIG. 13 is a block diagram illustrating an exemplary memory card including a three-dimensional semiconductor memory device based on the technical spirit of the inventive concept.

FIG. 13 is a block diagram illustrating an exemplary memory card including a three-dimensional semiconductor memory device based on the technical spirit of the inventive concept Referring to FIG. 13, a memory card 1200 according to an embodiment of the inventive concept may include a memory device 1210. The memory device 1210 may include at least one of the three-dimensional semiconductor memory devices disclosed in the embodiments described above. Also, the memory device 1210 may further include other types of semiconductor memory devices (e.g., DRAM device and/or SRAM device). The memory card 1200 may include a memory controller 1220 for controlling data exchange between a host and the memory device 1210.

The memory controller 1220 may include a central processing unit (CPU) 1222 controlling overall operations of the memory card 1200. Also, the memory controller 1220 may include an SRAM 1221 used as a working memory of the processing unit 1222. In addition, the memory controller 1220 may further include a host interface 1223 and a memory interface 1225. The host interface 1223 may be provided with a data exchange protocol between the memory card 1200 and the host. The memory interface 1225 may connect the memory controller 1220 and the memory device 1210. Furthermore, the memory controller 1220 may further include an error correction block (ECC) 1224. The ECC 1224 may detect and correct an error of data read from the memory device 1210. Although not shown, the memory card 1200 may further include a ROM device storing code data for interfacing with the host. The memory card 1200 may be used as a portable data storage card. Alternatively, the memory card 1200 may be provided in the form of a solid state disk (SSD) that can substitute for a hard disk of a computer system.

According to the three-dimensional semiconductor memory device, a cell string having a "U" shape can be implemented due to stacked first cell gates and a string selection gate, stacked second cell gates and a ground selection gate, first and second vertical-type active portions, and a conjunction doped region. Accordingly, a source line to which a reference voltage is applied can be formed of a conductive material having a low resistivity. Subsequently, a three-dimensional semiconductor memory device having excellent reliability can be implemented. Also, a three-dimensional semiconductor memory device capable of operating at a high speed can be implemented.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method for forming a three-dimensional semiconductor memory device, comprising:
    forming dielectric layers and sacrificial layers that are alternately and repeatedly stacked over the substrate;
    forming a groove penetrating the dielectric layers and the sacrificial layers;
    forming first dielectric patterns and first sacrificial patterns that are alternately stacked at one side of the groove, and second dielectric patterns and second sacrificial patterns that are alternately stacked at the other side of the groove, by forming a trench penetrating the dielectric layers and the sacrificial layers having the groove;
    replacing the first sacrificial patterns and second sacrificial patterns with first gates and second dates, respectively, the first gates comprising a plurality of first cell gates being stacked and a string selection gate over an uppermost first cell gate, and the second gates comprising a plurality of second cell gates being stacked and a ground selection gate over an uppermost second cell gate;
    forming an active structure comprising a first vertical-type active portion and a second vertical-type active portion in the groove, the first vertical-type active portion overlapping sidewalls of the first gates, and the second vertical-type active portion overlapping sidewalls of the second gates; and
    forming a conjunction doped region in the substrate, the conjunction doped region being connected to lower ends of the first and second vertical-type active portions.

2. The method of claim 1, further comprising:
    forming a bit line electrically connected to an upper end of the first vertical-type active portion; and
    forming a source line electrically connected to an upper end of the second vertical-type active portion.

3. The method of claim 2, wherein the bit line and the source line are located at different level with respect to a top surface of the substrate.

4. The method of claim 1, wherein the forming of the active structure comprises:

forming a preliminary active structure comprising a first preliminary active portion contacting a first sidewall of the groove and a second preliminary active portion contacting a second sidewall of the groove, and wherein the active structure is formed of portions of the preliminary active structure.

5. The method of claim 4, wherein the forming of the conjunction doped region comprises:

forming a preliminary doped region in the substrate under the groove by implanting dopant ions through the groove before the preliminary active structure is formed; and forming the conjunction doped region in the substrate under the active structure, by removing the preliminary doped region at both side of the active structure after the active structure is formed.

6. The method of claim 1, wherein the conjunction doped region is formed in the substrate before the dielectric layers and the sacrificial layers are formed, and the groove exposes the conjunction doped region.

7. The method of claim 6, further comprising forming a field dielectric pattern defining a base active portion in the substrate, wherein the conjunction doped region is formed in the base active portion.

8. A method for forming a three-dimensional semiconductor memory device, comprising:

forming dielectric layers and sacrificial layers that are alternately and repeatedly stacked over the substrate;

forming a first channel hole and a second channel hole that penetrate the dielectric layers and the sacrificial layers and are laterally spaced from each other;

forming a first vertical-type active portion and a second vertical-type active portion in the first channel hole and the second channel hole, respectively;

forming first dielectric patterns and first sacrificial patterns that are alternately stacked and have the first channel hole, and second dielectric patterns and second sacrificial patterns that are alternately stacked and have the second channel hole, by forming a trench penetrating the dielectric layers and the sacrificial layers having the first and second vertical-type active portions;

replacing the first sacrificial patterns and second sacrificial patterns with first gates and second gates, respectively, the first gates comprising a plurality of first cell gates being stacked and a string selection gate over an uppermost first cell gate, and the second gates comprising a plurality of second cell gates being stacked and a ground selection gate over an uppermost second cell gate; and forming a conjunction doped region in the substrate, the conjunction doped region being connected to lower ends of the first and second vertical-type active portions.

9. The method of claim 8, wherein the conjunction doped region is formed in the substrate before the dielectric layer and the sacrificial layers are formed, and the first and second channel holes expose portions of the conjunction doped region, respectively.

10. The method of claim 9, further comprising forming a field dielectric pattern defining a base active portion in the substrate, wherein the conjunction doped region is formed in the base active portion.

11. The method of claim 1, wherein replacing the first sacrificial patterns and second sacrificial patterns with the first gates and the second gates, respectively, comprises:

forming first empty regions and second empty regions by removing the first sacrificial patterns and the second sacrificial patterns; and forming first gates respectively disposed in the first empty regions and second gates respectively disposed in the second empty regions.

12. The method of claim 11, further comprising forming a gate dielectric layer in the first and second empty regions before the formation of the first gates respectively disposed in the first empty regions and the second gates respectively disposed in the second empty regions.

13. The method of claim 8, further comprising:

forming a bit line electrically connected to an upper end of the first vertical-type active portion; and forming a source line electrically connected to an upper end of the second vertical-type active portion.

14. The method of claim 13, wherein the bit line and the source line are located at a different level with respect to a top surface of the substrate.

15. The method of claim 8, wherein replacing the first sacrificial patterns and second sacrificial patterns with the first gates and the second gates, respectively, comprises:

forming first empty regions and second empty regions by removing the first sacrificial patterns and the second sacrificial patterns; and forming first gates respectively disposed in the first empty regions and second gates respectively disposed in the second empty regions.

16. The method of claim 15, further comprising forming a gate dielectric layer in the first and second empty regions before the formation of the first gates respectively disposed in the first empty regions and the second gates respectively disposed in the second empty regions.

* * * * *